United States Patent
Awaya et al.

(10) Patent No.: US 8,036,017 B2
(45) Date of Patent: Oct. 11, 2011

(54) SEMICONDUCTOR MEMORY DEVICE

(75) Inventors: Nobuyoshi Awaya, Osaka (JP); Takashi Nakano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 193 days.

(21) Appl. No.: 12/563,349

(22) Filed: Sep. 21, 2009

(65) Prior Publication Data

US 2010/0080038 A1   Apr. 1, 2010

(30) Foreign Application Priority Data

Sep. 26, 2008   (JP) ................. 2008-248180

(51) Int. Cl.
   *G11C 11/00*   (2006.01)
(52) U.S. Cl. ........ 365/148; 365/149; 365/163; 365/157; 365/171; 365/173
(58) Field of Classification Search ............ 365/149, 365/148, 157, 163, 171, 173
   See application file for complete search history.

(56) References Cited

U.S. PATENT DOCUMENTS

| | | | |
|---|---|---|---|
| 6,617,651 B2 | 9/2003 | Ohsawa | |
| 6,825,524 B1 | 11/2004 | Ikehashi et al. | |
| 7,085,156 B2 | 8/2006 | Ferrant et al. | |
| 7,433,222 B2 | 10/2008 | Hosoi et al. | |
| 7,933,139 B2 * | 4/2011 | Lung | 365/148 |
| 2003/0146469 A1 | 8/2003 | Matsuoka et al. | |
| 2004/0258866 A1 | 12/2004 | Shiba et al. | |
| 2004/0262635 A1 * | 12/2004 | Lee | 257/199 |
| 2004/0262679 A1 | 12/2004 | Ohsawa | |
| 2006/0211231 A1 * | 9/2006 | Asano et al. | 438/593 |
| 2008/0237695 A1 | 10/2008 | Shino et al. | |

FOREIGN PATENT DOCUMENTS

| | | |
|---|---|---|
| JP | 2003-31693 | 1/2003 |
| JP | 2003-229537 A | 8/2003 |
| JP | 2005-010448 A | 1/2005 |
| JP | 2005-026366 A | 1/2005 |
| JP | 2005-79314 | 3/2005 |
| JP | 2007-188603 | 7/2007 |
| JP | 2008-091492 A | 4/2008 |

OTHER PUBLICATIONS

Sungho Kim, Sung-Jin Choi, and Yang-Kyu Choi, "Resistive-Memory Embedded Unified RAM (R-URAM)," Nov. 2009, IEEE Transactions on Electron Devices, vol. 56, No. 11.*
Takata et al., "Nonvolatile SRAM based on Phase Change", *IEEE*, 2006, pp. 95-96.
Wang et al, "Nonvolatile SRAM Cell", *IEEE*, 2006, 4 pages.

* cited by examiner

*Primary Examiner* — Vu Le
*Assistant Examiner* — Han Yang
(74) *Attorney, Agent, or Firm* — Nixon & Vanderhye, P.C.

(57) ABSTRACT

An inexpensive nonvolatile memory having high performance which makes random write and readout possible an unlimited number of times is provided. A unit memory cell is formed of a MISFET having a channel body that is electrically isolated from a semiconductor substrate and a resistance change element having a two-terminal structure with one end electrically connected to a drain of the MISFET. The MISFET functions as a volatile memory element, and the resistance change element functions as a nonvolatile memory element, so that information stored in the MISFET is copied to the resistance change element before the power is turned OFF and information stored in the resistance change element is transferred to the MISFET when the power is turned ON, and thus, the MISFET is used as a volatile memory which makes random write and readout possible.

11 Claims, 21 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2008-248180 filed in Japan on 26 Sep. 2008 the entire contents of which are hereby incorporated by reference.

BACKGROUND OF THE INVENTION

1. Field of the Invention

The present invention relates to a semiconductor memory device.

2. Description of the Related Art

Semiconductor memory devices are currently indispensable key devices for electronic devices. Semiconductor memory devices are mainly categorized into volatile memories represented by SRAMs and DRAMs and non-volatile memories represented by flash memories. Memory data in SRAMs and DRAMs can be read out and written at a high speed and at random, and thus, they are memories that can be very easily handled, but they are volatile memories that cannot hold data without a power supply.

SRAMs have better performance than DRAMs in the speed of operation and the holding of data as volatile memories, but the area occupied by the device is greater and the cost is higher, and therefore, the majority of the market is occupied by DRAMs, of which the cost is lower. In DRAMs, each memory cell is made up of one transistor and one capacitor, and the degree of integration of the memory has increased as the process dimensions have been scaled down. In recent years, however, the limits of miniaturization have been pointed out mainly due to the difficulty in the scaling down of the capacitor, and under such circumstances, research has been performed as in Documents 1 to 4 cited below on one-transistor type DRAMs where a majority carrier is accumulated in the channel body of the transistor so that the memory is held.

Document 1: Japanese Unexamined Patent Publication No. 2003-31693
Document 2: Japanese Unexamined Patent Publication No. 2005-79314
Document 3: U.S. Pat. No. 7,085,156
Document 4: U.S. Pat. No. 7,085,153

FIGS. 1A to 1C are schematic cross-sectional diagrams showing the device structure of a one-transistor type DRAM described in the above Documents 1 to 4. An insulating film 102 is formed on a semiconductor substrate 101, and an n type source region 103, an n type drain region 104 and a p type channel body region 105 of a MISFET are formed in a semiconductor layer electrically separated from the semiconductor substrate 101 by means of the insulating film 102, that is to say, in a so-called SOI (silicon on insulator) substrate. A gate electrode 107 is formed above the channel body region 105 with a second insulating film 106 in between. Data is stored in two states: a state "1" where a majority carrier (holes) is accumulated excessively in the channel body region 105, and a state "0" where there is no excessive accumulation.

At this time, the state "1" is programmed by operating the MISFET in a pentode region so that a large current from the drain region 104 flows and impact ionization is caused in the vicinity of the drain region 104 (FIG. 1A). Holes that are generated through this impact ionization and are a majority carrier that is excessively accumulated are held in the channel body region 105. Meanwhile, the state "0" is programmed by applying a voltage between the drain region 104 and the channel body region 105 in the forward direction, so that the excessive holes are released from the channel body region 105 (FIG. 1B). The difference between the two states "1" and "0" can be detected as a difference in the threshold voltage of the MISFET. That is to say, a low threshold voltage shows the state where a majority carrier is excessively accumulated, while a high threshold voltage shows the state of no excessive accumulation. When a voltage that is in the middle of the two threshold voltages is applied to the gate electrode, a large current flows in the state where a majority carrier is excessively accumulated and no current flows in the state of no excessive accumulation, and thus, the two states can be distinguished (FIG. 1C). FIG. 2 shows the dependency of the drain current on the gate voltage in the case where a predetermined drain voltage (0.2V) is applied in each state of "1" and "0."

Meanwhile, most of the non-volatile memories currently available in the market are devices categorized into a flash memory.

Flash memories are non-volatile memories which hold memory even when the power supply is turned off, but there is a limitation in the method for writing and reading out as well as the rate of writing and the number of times of writing, and thus, flash memories are not easy to use as compared to DRAMs and SRAMs.

Therefore, it is common in conventional electronic devices that data stored in a non-volatile memory is shifted to a volatile memory at the start up of the device so that the volatile memory is used as a working memory, and the data in the volatile memory is again stored in the non-volatile memory at the time of shutting down the device.

A non-volatile memory where data can be written and read out at random and without limitation, which is a so-called ideal memory, would be gained by combining the good points of the above described volatile memories and the non-volatile memories. Therefore, implementation thereof has been attempted. MRAMs, FeRAMs, PCRAMs, RRAMs and the like have been researched as non-volatile memories that could be substituted for the flash memory, for example. These are currently in the stage of being developed, and they have better performance than the flash memory in that data can be written at random.

A non-volatile memory where random writing and random reading out are possible can be implemented theoretically by FeRAMs, PCRAMs, RRAMs and MRAMs, but their writing performance is inferior to that of the conventional DRAMs. The number of times where writing is possible has been increasing in PCRAMs and RRAMs year after year, but the number of times of writing is not infinite and is approximately $10^9$ times at the most, and thus, concern remains in securing sufficient reliability as a RAM where writing is always possible.

In PCRAMs and RRAMs, resistance change elements where the resistance value changes through the application of a voltage are used as memory cells for storing information. The resistance change elements have two or more states by controlling the voltage applied between two terminals and the flowing current. In PCRAMs using chalcogenide, for example, the resistance change elements can be switched between a low resistance state, which is a crystal state, and a high resistance state, which is an amorphous state by controlling the applied voltage and the applying time. In addition, in RRAMs using a metal oxide, the resistance change elements can be controlled between a low resistance state and a high resistance state by changing the amount of deficit of oxygen or a metal through the switching between the positive and the negative of the applied voltage or the control of the applied voltage and the load resistance.

FIGS. 3A and 3B show the exemplary properties of a resistance change element using a metal oxide (cobalt oxide or copper oxide, for example) where the resistance change element can be controlled between two states, a low resistance state and a high resistance state by switching the connected load resistance and controlling the applied voltage. FIG. 3A shows voltage current properties and FIG. 3B shows an equivalent circuit. In FIG. 3A, V1 and I1 are respectively a threshold voltage and current that make the high resistance state unstable, and V2 and I2 are respectively a threshold voltage and current that make the low resistance state unstable. When a load resistance R is connected to the resistance change element in a high resistance state and a voltage Va is applied, the voltage V applied to the resistance change element can be represented by Va−RI (I is a current flowing across the element), and therefore, the resistance change element shifts to a certain low resistance state A along the load resistance curve V=Va−RI. In contrast, when a load resistance r is connected to the resistance change element in a low resistance state and a voltage Vb is applied, the resistance change element shifts to a high resistance state B along the load resistance curve V=Vb−rI.

FIG. 4A shows the voltage current properties in the case where the resistance change element is controlled by switching the positive and negative of the voltage, and FIG. 4B shows an equivalent circuit. In the case where the resistance change element is connected to a rectifying element having different resistance values when the applied voltage is switched between positive and negative in such a manner that the resistance is R when a positive voltage is applied and the resistance is r when a negative voltage is applied, for example, the high resistance state can be shifted to a low resistance state C by applying a positive voltage Va, and the low resistance state can be shifted to a high resistance state D by applying a negative voltage Vb', and thus, a so-called bipolar switch can be implemented. When an oxide of cobalt, nickel or copper is used as the metal oxide, titanium nitride is used for one electrode and tantalum is used for the other electrode, for example, Schottky type rectifying properties are provided between the metal oxide and the tantalum electrode, and thus, a resistance change element capable of performing a bipolar switching operation can be formed.

The properties and the controlling method of the resistance change element of an RRAM are disclosed in detail in Japanese Unexamined Patent Publication 2007-188603.

RRAMs have such advantages that data is written through the application of a voltage, and therefore, the amount of current is very small, thus making the power consumption low; a relatively simple structure makes the cell area smaller, and thus, increases the density (lowering the cost); and the reading out time is as short as that of DRAMs. However, the number of times of possible writing is approximately $10^9$ at the most, though it has been increasing year after year, and thus, no RRAMs can be used as a DRAM where writing is always possible.

Though the number of times of possible writing is greater in FeRAMs than in PCRAMs or RRAMs, it is still difficult for FeRAMs to be substituted for DRAMs due to destructive read out. Though MRAMs theoretically have an infinite number of times of writing, a current directly flows through the tunnel film in a spin injection type MRAM which makes scaling down of the cell size possible, and therefore, deterioration through writing cannot be completely avoided. In addition, it is difficult for PCRAMs to be substituted for a volatile memory due to the low rate of writing.

Therefore, a technology for combining a volatile memory cell and a non-volatile memory cell to form a single memory cell has been examined.

The following Documents 5 and 6 disclose structures where a non-volatile memory cell and an SRAM cell are combined in one memory cell, for example. In these structures, the data stored in the non-volatile memory portion within the memory cell is transferred to the SRAM cell at the time of start up, and the memory cell functions as the SRAM after the transfer.

Document 5: Masashi Takada and five others, "Nonvolatile SRAM based on Phase Change," IEEE Non-Volatile Semiconductor Memory Workshop, 2006, p. 95

Document 6: Wei Wang and seven others, "Nonvolatile SRAM cell," Technical Design of International Electron Device Meeting (IEDM), 2006, p. 785

Document 5 describes a structure where a PCRAM cell and an SRAM cell are combined to form one memory cell unit, and Document 6 describes a structure where an RRAM cell and an SRAM cell are combined to form one memory cell unit, and these have both a function of making random writing and reading out possible and a function of a non-volatile memory that can hold the memory when the power supply is turned off. However, the structures are based on the structure of an SRAM circuit, and therefore, the size of the memory is great and the cost is high, thus making it difficult for the structures to be substituted for multipurpose DRAMs or DRAMs mixed in system LSIs.

Meanwhile, conventional standard DRAMs are made up of 1T1C type memory cell units where a control transistor and a capacitor are connected in series. It is theoretically difficult to combine a circuit structure for holding information when a charge is accumulated in a capacitor and a circuit structure for holding information through a change in the resistance value, as in PCRAMs and RRAMs. This is because in the case where a resistance change element and a capacitor are connected in series, the difference in the potential between the two ends of the resistance change element becomes zero with no current flowing when a certain amount of charge is accumulated in the capacitor. In addition, both in PCRAMs and RRAMs, only the amount of charge accumulated in the capacitor in the DRAM cells is too small to change the resistance value for writing. In the case where a resistance change element and a capacitor are connected in parallel, the charge accumulated in the capacitor flows out through the resistance change element, and therefore, information cannot be held. Though it may be necessary to add another transistor to the memory cell units, the circuit area is made large, which causes an increase in the cost.

In contrast, SOI-DRAMs can be regarded as a volatile resistance change element with three terminals in that the stored information appears as a difference in the threshold voltage, that is to say, a difference in the channel resistance between transistors, and thus, the present inventor conducted diligent research and focused on the fact that the matching level is high for the combination with a resistance change element. The allocation ratio of the voltages applied to an SOI-DRAM cell and a resistance change element can be changed by controlling the voltage applied to a gate terminal, which is the third terminal, and therefore, it is theoretically possible to transfer information stored in the SOI-DRAM cell and the resistance change element mutually. However, unless the properties of the resistance change element and the properties of the SOI-DRAM are both understood in detail, malfunctioning occurs such that information in the resistance change element is written when information stored in the SOI-DRAM is written, and therefore, they cannot be normally operated as a memory.

SUMMARY OF THE INVENTION

An object of the present invention is to provide a high-performance semiconductor memory device having both a volatile memory function which makes random writing and read-out possible and non-volatile memory performance which allows the stored information to be held even when the power is turned off within memory cell units at low cost.

The semiconductor memory device according to the present invention is a semiconductor memory device comprising a plurality of memory cells each having a MISFET and a resistance change element, the MISFET having a channel body that is electrically isolated from a semiconductor substrate, the resistance change element having a two-terminal structure with one terminal electrically connected to a drain of the MISFET, and first characterized in that the MISFET functions as a volatile memory element for storing a first state where a majority carrier is accumulated in the channel body and a second state where the majority carrier in the channel body is released, and the resistance change element functions as a nonvolatile memory element for holding two or more states having different resistance values and for being switched between the states switch in a reversible manner when a voltage is applied.

In addition to the above described first characteristic, the semiconductor memory device according to the present invention is second characterized in that the MISFET has a source, a drain and a channel body region within a semiconductor layer that is electrically isolated from the semiconductor substrate with an insulating film, and a gate electrode formed above the channel body region with a second insulating film in between.

In addition to the above described first characteristic, the semiconductor memory device according to the present invention is third characterized in that the MISFET has a source region, a channel body region and a drain region in this order, each of which is formed as a layer within a region in column form on the semiconductor substrate in a depth direction, the side walls of the channel body region are completely covered with an insulating film so as to be electrically isolated from the semiconductor substrate, and a gate electrode is formed to the side of the channel body region with the insulating film in between.

In addition to any of the above described first to third characteristics, the semiconductor memory device according to the present invention is fourth characterized in that the memory cells are arranged in a matrix, gate electrodes of the MISFETs aligned in the same row are connected to a common word line extending in a row direction, other terminals of the resistance change elements having the one terminals connected to drain regions of the MISFETs aligned in the same column are connected to a common bit line extending in a column direction, and source regions of the MISFETs are connected to the ground or a fixed potential.

In addition to the above described fourth characteristic, the semiconductor memory device according to the present invention is fifth characterized in that, in a set operation mode, data stored as a resistance state of the resistance change element is transferred to the MISFET as an accumulation state of a majority carrier in the channel body of the MISFET so that the memory cell operates as a volatile memory device, and in a reset operation mode, data stored as the accumulation state of the majority carrier in the channel body of the MISFET is transferred to the resistance change element and stored as the resistance state of the resistance change element.

In addition to the above described fifth characteristic, the semiconductor memory device according to the present invention is sixth characterized in that the set operation mode has a first set operation mode and a second operation mode, in the first set operation mode, data stored as the resistance state of the resistance change element is copied as the accumulation state of the majority carrier in the channel body of the MISFET by applying respective predetermined voltages to a word line and a bit line of the memory cell, the predetermined voltages allowing the majority carrier to be accumulated in the channel body of the MISFET of the memory cell where the resistance change element is in a low resistance state, but not allowing the majority carrier to be accumulated in the channel body of the MISFET in the memory cell where the resistance change element is in a high resistance state, and in the second set operation mode, a state of the resistance change element is switched from the high resistance state to the low resistance state by selecting the memory cell where the resistance change element is in a high resistance state and applying respective predetermined voltages to the word line and the bit line of the selected memory cell.

In addition to the above described sixth characteristic, the semiconductor memory device according to the present invention is seventh characterized in that the resistance state of the resistance change element is not switched in the first set operation mode.

In addition to the above described sixth characteristic, the semiconductor memory device according to the present invention is eighth characterized by further comprising a load transistor that is connected in series to the MISFET and the resistance change element within the memory cell via the bit line in the second set operation mode, wherein a part of a voltage applied to the resistance change element when the resistance change element is in the high resistance state is applied to the load transistor when the resistance change element shifts to the low resistance state so that a voltage applied between the source and drain of the MISFET is equal to or lower than a threshold value for inducing the majority carrier to the channel body.

In addition to the above described sixth characteristic, the semiconductor memory device according to the present invention is ninth characterized in that, in the reset operation mode, the state of the MISFET within the memory cell is read out and respective predetermined voltages are selectively applied to the bit line and the word line in the memory cell where the majority carrier is not accumulated so that the state of the resistance change element within the memory cell is switched from the low resistance state to the high resistance state.

In addition to the above described fourth to ninth characteristics, the semiconductor memory device according to the present invention is tenth characterized in that some of the memory cells arranged in a matrix are used as a nonvolatile memory region where only the resistance state of the resistance change elements is used as stored data.

In addition to the above described fifth to ninth characteristics, the semiconductor memory device according to the present invention is eleventh characterized in that some of the memory cells arranged in a matrix are used as a nonvolatile memory region where only the resistance state of the resistance change elements is used as stored data, and the operation conditions at the time of the set operation mode and the reset operation mode are stored in the nonvolatile memory region, and each state of the MISFET and the resistance change element changes in accordance with the operation conditions stored in the nonvolatile memory region in the set operation mode or the reset operation mode.

In the semiconductor memory device according to the present invention, each cell is formed of a MISFET having a channel body that is electrically isolated from the semiconductor substrate and a resistance change element having a two-terminal structure with one terminal electrically connected to the drain of the MISFET. The MISFET has the same structure as the one-transistor type volatile memory cells described in the above Documents 1 to 4, that is to say, stores a first state where a majority carrier is accumulated in the channel body and a second state where the majority carrier is released from the channel body, so that the storage state can be read out from the difference in the threshold voltage between these two states, and thus, a volatile memory element which makes random write and random read-out possible is provided. In contrast, the resistance change element that is electrically connected to the drain of the MISFET is a two-terminal element where a material of which the resistance state switches in a reversible manner when a voltage is applied is sandwiched between two electrodes for holding two or more states with different resistance values, and thus, a nonvolatile memory element using these states as storage states is provided.

The above described volatile memory elements can be implemented with a MISFET formed on an SOI (silicon on insulator) electrically isolated from the semiconductor substrate with an insulating film formed on the semiconductor substrate, or with a vertical MISFET where the side walls of the channel body region are covered with an insulating film so that the channel body region is electrically isolated from the semiconductor substrate.

According to the present invention, memory cells are arranged in a matrix, the gate electrodes of the MISFETs, which are volatile memory elements, are connected to word lines, and one end of the resistance change elements, which are nonvolatile memory elements, is connected to the drain regions of the MISFETs, and the other end is connected to the bit lines, and thus, a semiconductor memory device is formed. Two different memory functions for a volatile memory and a volatile memory are built-in in each memory cell, and therefore, the memory cells can form a nonvolatile semiconductor memory device which has the advantages of both volatile memories and nonvolatile memories, and can carry out writing and read-out at random an unlimited number of times.

The semiconductor memory device according to the present invention has a volatile memory function, due to the above described MISFET, and a nonvolatile memory function, due to the resistance change element in a desirable form, and therefore, has the following operation modes.

<Set Operation Mode>

Nonvolatile data stored as the resistance state of a resistance changing element is transferred to a MISFET as the accumulation state of a majority carrier in the channel body of the MISFET, and thus, the memory cell operates as a volatile memory device in this operation mode.

<Reset Operation Mode>

Volatile data stored as the accumulation state of a majority carrier in the channel body of a MISFET is transferred to a resistance changing element as the resistance state of the resistance changing element so as to be stored in this operation mode.

Furthermore, it is desirable for the set operation mode to be divided into the following two operation modes (first set operation mode and second set operation mode).

<First Set Operation Mode>

Predetermined voltages are applied to the word line and the bit line of a memory cell, respectively so that data stored as the resistance state of a resistance changing element is copied as the accumulation state of the majority carrier of the channel body of the above described MISFET in this operation mode.

At this time, the voltage applied to the word line (gate voltage) and the voltage applied to the bit line (voltage between source and drain) are adjusted so that the majority carrier is accumulated in the channel body of the MISFET in the memory cell where the resistance change element is in a low resistance state, and the majority carrier is not accumulated in the channel body of the MISFET in the memory cell where the resistance change element is in a high resistance state, and therefore, it becomes possible to copy the low resistance state of the resistance change element and the high resistance state of the resistance change element as a state where the majority carrier is accumulated in the channel body of the MISFET and a state where the majority carrier is not accumulated in the channel body of the MISFET, respectively.

Herein, it is desirable for the state of the resistance change element not to change in the first set mode operation. When the resistance state changes, the accumulation state of the majority carrier in the channel body of the MISFET corresponding to the resistance change element in the high resistance state becomes non-uniform, and therefore, it becomes necessary to adjust the voltage applied when the state of the resistance change element in a high resistance state is switched to a low resistance state at the time of the below described second set operation in accordance with whether or not there is a majority carrier in the channel body of the MISFET, and thus, control of the resistance state becomes complex.

<Second Set Operation Mode>

A memory cell where the resistance change element is in a high resistance state is selected and predetermined voltages are applied to the word line and the bit line connected to the selected memory cell, respectively, so that the state of the resistance change element in a high resistance state is switched to a low resistance state in this operation mode.

At this time, the resistance change element is switched from a high resistance state to a low resistance state, and therefore, the voltage lowers by the voltage drop due to the resistance change element, and the voltage applied between the source and the drain of the MISFET rises by the same amount. In order to suppress the voltage applied between the source and the drain of the MISFET equal to or lower than the threshold voltage, which allows the majority carrier to be induced in the channel body of the MISFET, and prevent the storage state of the MISFET from changing, a load transistor may be connected to the MISFET and the resistance change element in series, so that the voltage applied between the source and the drain of the MISFET is partially applied to the load transistor.

The semiconductor memory device having the above described operation modes can be formed as a nonvolatile semiconductor memory device having the advantages of a volatile memory function, due to MISFET, and a nonvolatile memory function, due to the resistance change elements, which can carry out write and read-out at random and an unlimited number of times when operated as follows.

(1) Data is stored as the resistance state of a nonvolatile resistance change element in a state where the power is turned OFF.

(2) When the power is turned ON, data stored as the resistance state of the resistance change element is copied as the accumulation state of the majority carrier in the channel body of the MISFET in the first set operation mode.

(3) After the data stored as the resistance state of the resistance change element is copied as the accumulation state of the majority carrier in the channel body of the MISFET, all of the resistance change elements are converted to a low resistance state in the second set operation mode.

(4) Only the MISFETs are used as a volatile memory which can be written and read-out at random and at a high speed.

(5) Before the power is turned OFF, the reset operation mode is performed to read out the state of the MISFET in each memory cell, and apply respective predetermined voltages only to the bit line and the word line of the memory cells where the majority carrier is not accumulated, so that the state of the resistance change element within the memory cell switches from a low resistance state to a high resistance state.

Although the semiconductor memory device according to the present invention has both the memory function of a volatile memory and that of a nonvolatile memory, it is possible that part of the region of the memory cells arranged in a matrix is used only as a nonvolatile memory region and the volatile memory function is not used. At this time, the conditions for operations such as optimal voltage to be applied in the above described set operation mode and reset operation mode are stored in the nonvolatile memory region, so that the conditions for operation stored in the nonvolatile memory region are read out in each operation mode, and thus, the states of the MISFET and the resistance change element can be controlled in accordance with the conditions for operation.

As described in detail above, in the semiconductor memory device according to the present invention, a memory cell, which has both the function of a volatile memory and that of a nonvolatile memory and operates as a volatile memory which can carry out random writing and read-out an unlimited number of times when the power is turned ON, while storing data in a nonvolatile memory when the power is turned OFF, can be formed in the same size as that of current DRAMs, and as a result, a nonvolatile RAM having high performance can be provided at low cost.

DETAILED DESCRIPTION OF THE INVENTION

In the following, the semiconductor memory device according to the embodiments of the present invention is described in reference to the drawings.

First Embodiment

Figure 5:
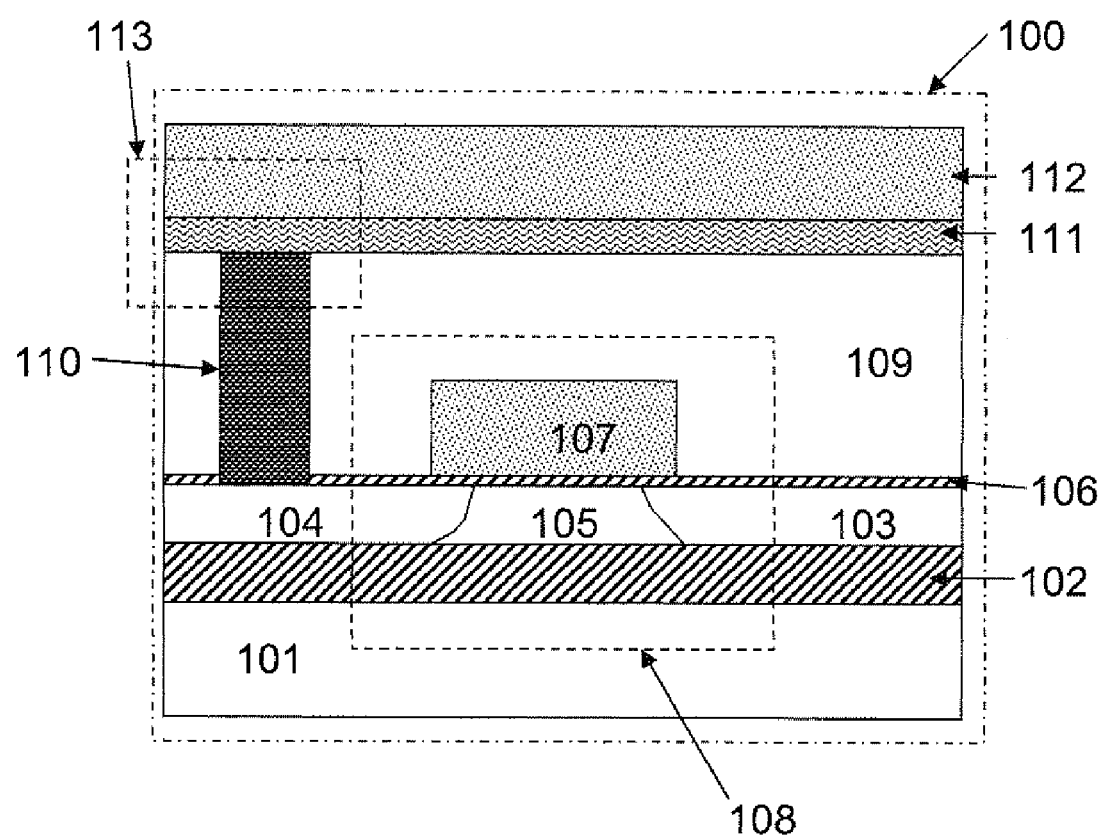
FIG. 5 is a cross-sectional diagram showing the structure of a semiconductor memory device (memory cell) according to the first embodiment of the present invention.
Figure 6:
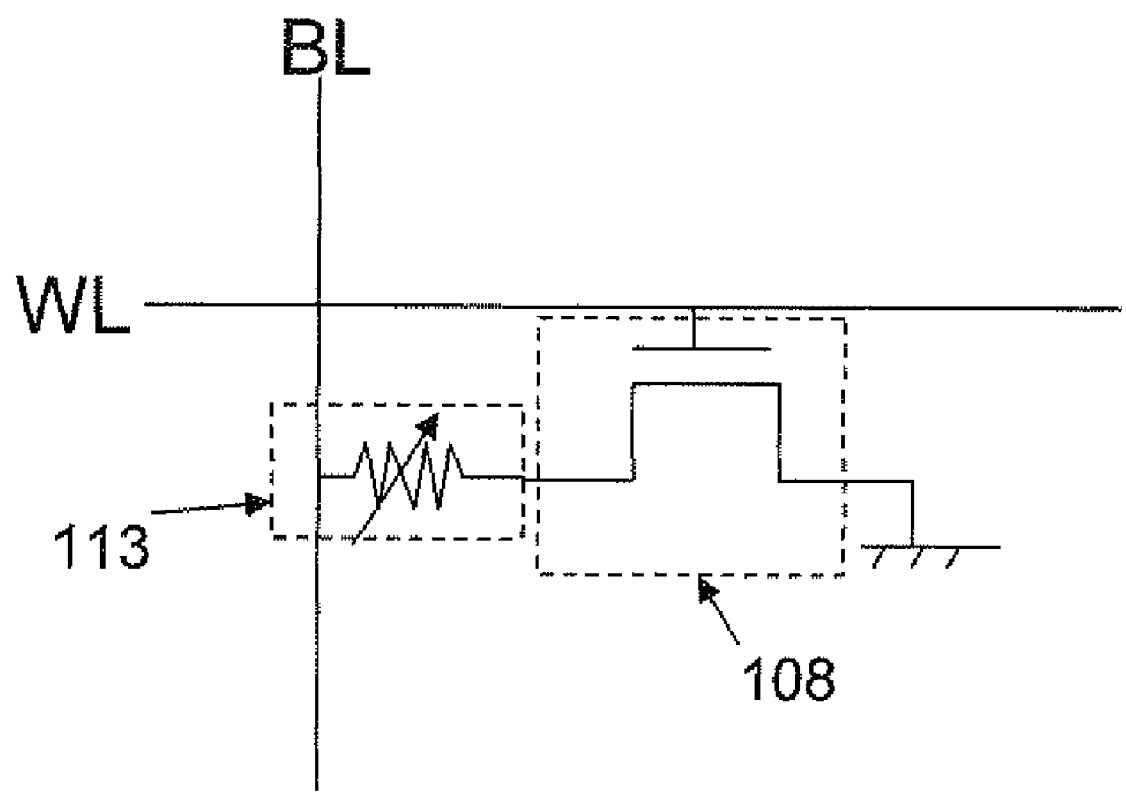
FIG. 6 is an equivalent circuit diagram showing the semiconductor memory device (memory cell) according to the first embodiment of the present invention.

FIG. 5 is a cross-sectional diagram showing the structure of a memory cell 100 in the semiconductor memory device according to the first embodiment of the present invention. An insulating film (silicon oxide film) 102 is formed on a silicon substrate 101, and an n type source region 103, an n type drain region 104 and a p type channel body region 105 of a MISFET 108 are formed in the semiconductor layer (SOI substrate), which is electrically isolated from the semiconductor substrate 101 by means of the insulating film 102. A gate electrode 107 is formed above the channel body region 105 with a second insulating film 106 in between. An interlayer insulating film 109 is formed over the MISFET 108, and a contact hole is created in the interlayer insulating film 109 for contact on the upper surface of the drain region 104, and the contact hole is filled in with a contact plug 110. The contact plug 110 is formed by combining a barrier metal of Ti/TiN and W, which is the same as generally used in silicon processes. The contact plug 110 is connected to a metal wire 112 via the resistance change material 111 on the contact plug. The resistance change material 111 is a material of which the resistance changes when a voltage is applied, and a metal oxide film, such as of Co, Ni or Ti, a chalcogenide film or a solid electrolyte film, for example, can be used. A resistance change element 113 is formed to have a two-terminal structure with the contact plug 110 and the metal wire 112 which sandwich the thin film from the top and bottom used as upper and lower electrodes. The channel body region 105 in the MISFET 108 is electrically isolated by the drain region 104, the source region 106 and the element isolation region (not shown) in the rear and front vertical to the paper. The MISFET 108 and the resistance change element 113 form one memory cell 100. FIG. 6 shows an equivalent circuit of this structure. The metal wire 112 connected to the drain region 104 via the resistance change element is connected to a bit line (BL), the gate electrode 105 is connected to a word line (WL), and the source region 103 is connected to a fixed potential.

Figure 7:
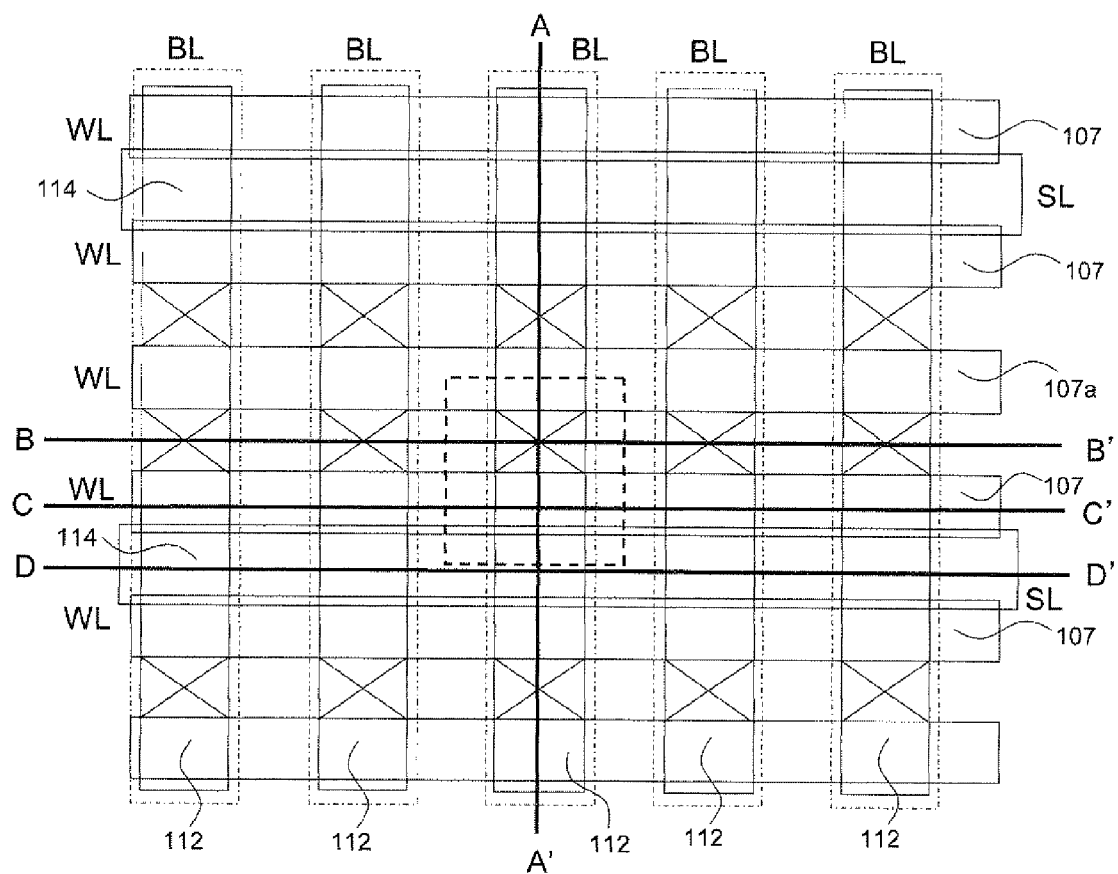
FIG. 7 is a diagram showing the layout of the semiconductor memory device (memory cell array) according to the first embodiment of the present invention.
Figure 8A:
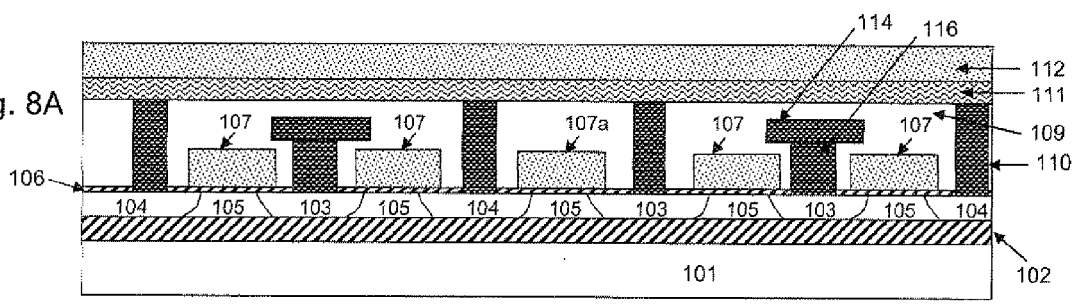
FIGS. 8A to 8D are cross-sectional diagrams showing the structure of the semiconductor memory device (memory cell array) according to the first embodiment.

The memory cells 100 can be arranged in a matrix, as a single memory cell array. FIG. 7 shows the structure in a plane, and FIGS. 8A to 8D are cross-sectional diagrams of the same. FIGS. 8A, 8B, 8C and 8D are cross-sectional diagrams along A-A', B-B', C-C' and D-D', respectively, in FIG. 7. FIG. 9 shows an equivalent circuit of FIGS. 7 to 8D.

An insulating film (silicon oxide film) 102 is formed on a silicon substrate 101, and MISFETs formed in accordance with the 180 nm rule are arranged in a matrix in the semiconductor layer (SOI substrate) that is electrically isolated from the semiconductor substrate 101 by means of the insulating film 102. The channel length of the MISFETs is approximately 180 nm, and the film thickness of the gate oxide film 106 is approximately 6 nm. The drain region 104 of the MISFETs is connected to the lower end of the resistance change material layer 111 via the first contact plugs 110, and the upper end of the resistance change material film 111 is connected to bit lines (BL) extending in the column direction (A-A' direction) via the metal wires 112 (FIG. 8A). The gate electrodes 107 of the MISFETs are connected in the row direction (C-C' direction) so as to form word lines (WL) extending in the row direction (FIG. 8C). Contact holes are created in the interlayer insulating film 109 for contact on the upper surface of the source regions 103, and second contact plugs 116 are formed from the upper surface of the source regions 103 to approximately half of the interlayer insulating film 109, that is, slightly above the gate electrode. Second metal wires 114 are formed on top of the second contact plugs 116 in the row direction (D-D' direction) so as to connect the source regions 103 of the MISFETs and work as source lines (SL) extending in the row direction (FIGS. 8A and 8D). The source regions 103 are connected to the ground or a fixed potential via the source lines.

Figure 8B:
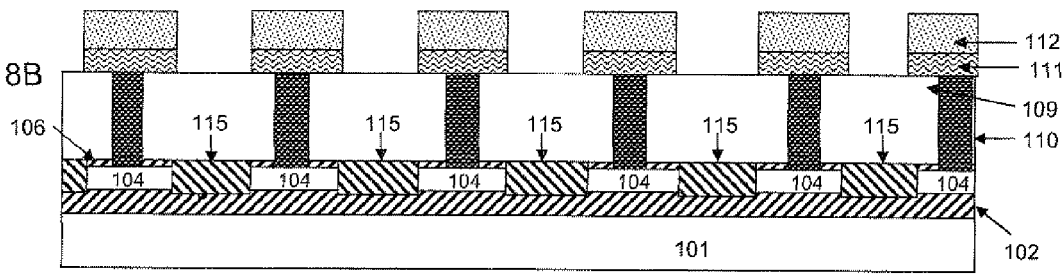
Figure 8C:
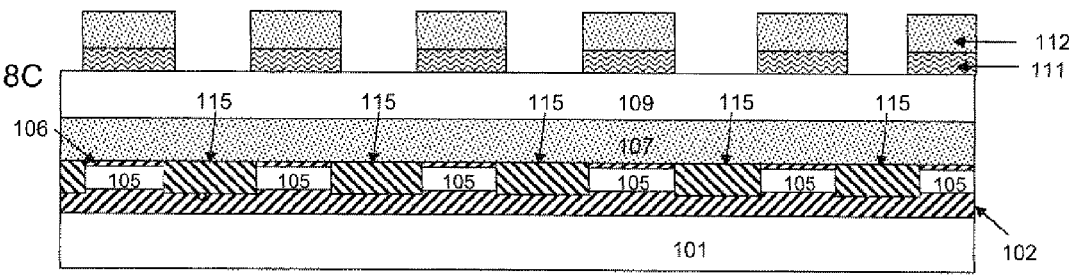
Figure 8D:
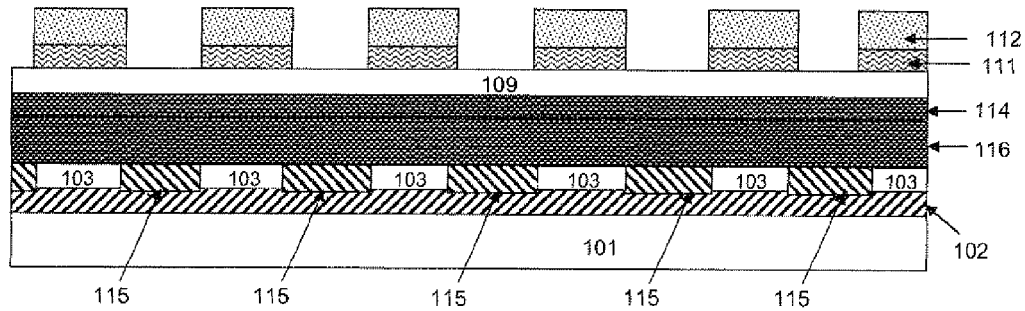
Figure 9:
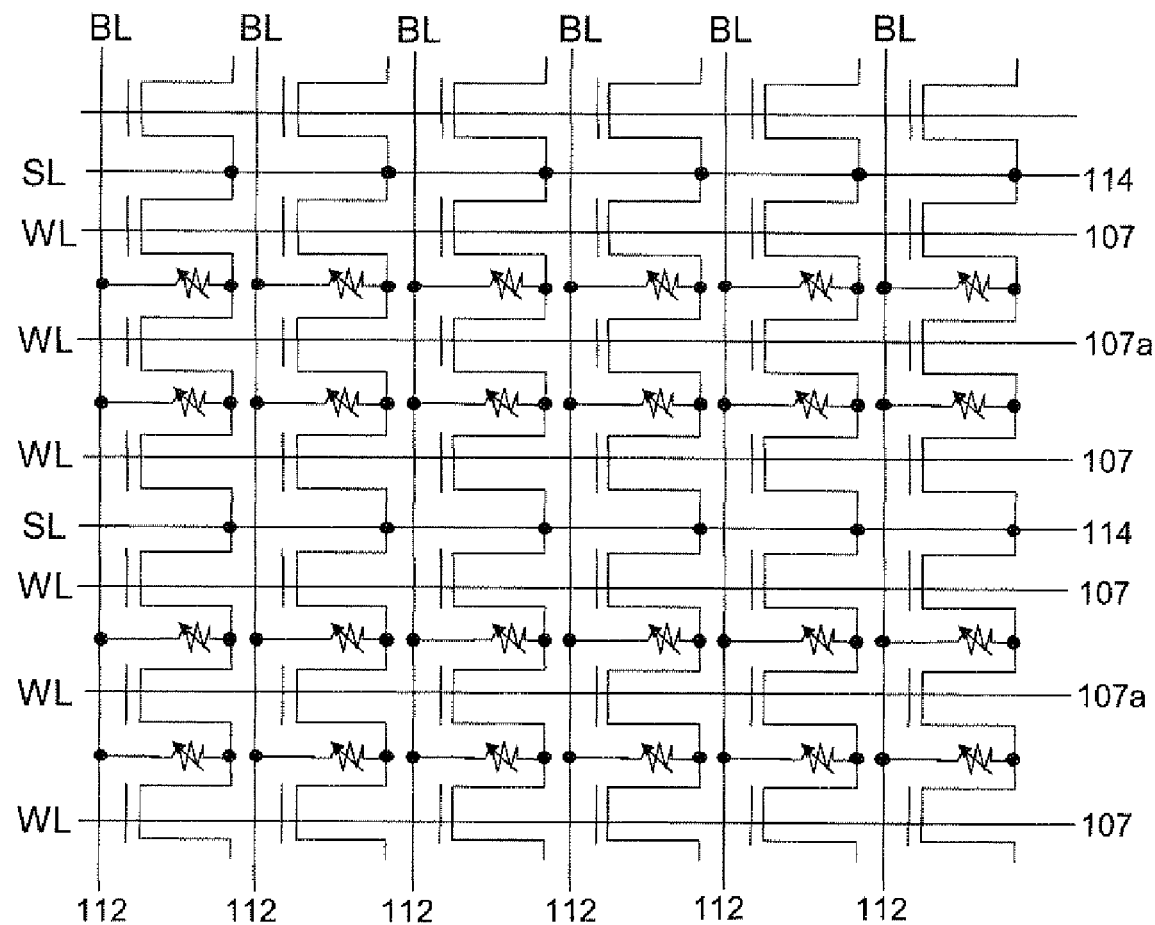
FIG. 9 is an equivalent circuit diagram showing the semiconductor memory device (memory cell array) according to the first embodiment of the present invention.

The n type source regions 103, the n type drain regions 104 and the p type channel body regions 105 of the MISFETs 108 are isolated from each other in the column direction by means of an STI (shallow trench isolation) element isolation film 115, as shown in FIGS. 8B to 8D, so as to form element regions in stripes in the direction parallel to the bit lines. As shown in FIG. 8A, the source regions 103 are shared by adjacent MISFETs, while the drain regions 104 are not shared by adjacent MISFETs. This is because the resistance change elements formed between the drain regions 104 and the bit lines 112 are integrated with MISFETs so as to form single memory cells. Therefore, it is necessary for every third MISFET to be a dummy, and turned off all of the time, in order to separate the drain regions 104 from each other via the gate electrodes 107*a*. When the word lines and the bit lines in the above described layout are provided with the minimum size F, the area of unit cells becomes $6F^2$ (F is the minimum size for processing).

The above described semiconductor memory device can be manufactured as follows. (1) An SOI substrate where the film thickness of the buried insulating film 102 is approximately 30 nm is manufactured, and a p type layer is epitaxially grown on top. The film thickness of the epitaxial layer may be approximately 50 nm. (2) An n type impurity (phosphorous) is ion implanted in predetermined locations in the epitaxial layer, so that source regions 103 and drain regions 104 are formed. The rest of the p type epitaxial layer forms channel body regions 105. The impurity concentration of the source regions 103 and the drain regions 104 may be approximately $10^{20}$ cm$^{-3}$, and can be manufactured in a standard ion implantation process. (3) A second insulating film 106, which becomes the gate oxide film, is grown on top of the epitaxial layer. The film thickness of the insulating film may be approximately 6 nm. (4) Deep trenches are created in the column direction through anisotropic etching so as to reach the SOI substrate, and filled in with an insulating film, for example an oxide film, so that an element isolation region 115 is formed. (5) Gate electrodes 107 made of polycrystal silicon are formed on top of the second insulating film 106 above the channel body regions 105, and provide word lines extending in the row direction. (6) An interlayer insulating film is formed in two stages. First, a first interlayer insulating film is deposited to such a level as to cover the gate electrodes (word lines) 107 and then flattened. (7) Contact holes are created above the source regions 103, and second contact plugs 116 are formed from the upper surface of the source regions 103 to the top of the first interlayer insulating film. Metal wires 114 are provided on top of the second contact plugs 116, and thus, source lines which extend in the row direction and are connected to a fixed potential are formed. (8) The second interlayer insulating film is deposited to a predetermined level and flattened. (9) Contact holes are created above the drain regions 104 and first contact plugs 110 which penetrate through the first and second interlayer insulating films are formed from the upper surface of the drain regions 104. (10) A resistance change material thin film 111 is formed on top of the first contact plugs 110 in the column direction, and metal wires 112 are formed on top of this, and thus, bit lines extending in the column direction are formed. The resistance change material is, for example, a Co oxide film, and the film thickness may be approximately 10 nm. As a result, a resistance change element having a rate of programming and erasing operation of approximately 10 ns and a current required for writing of 100 μA or less, and a resistance changing ratio of approximately 10 to 100 can be provided within each memory cell.

Figure 10:
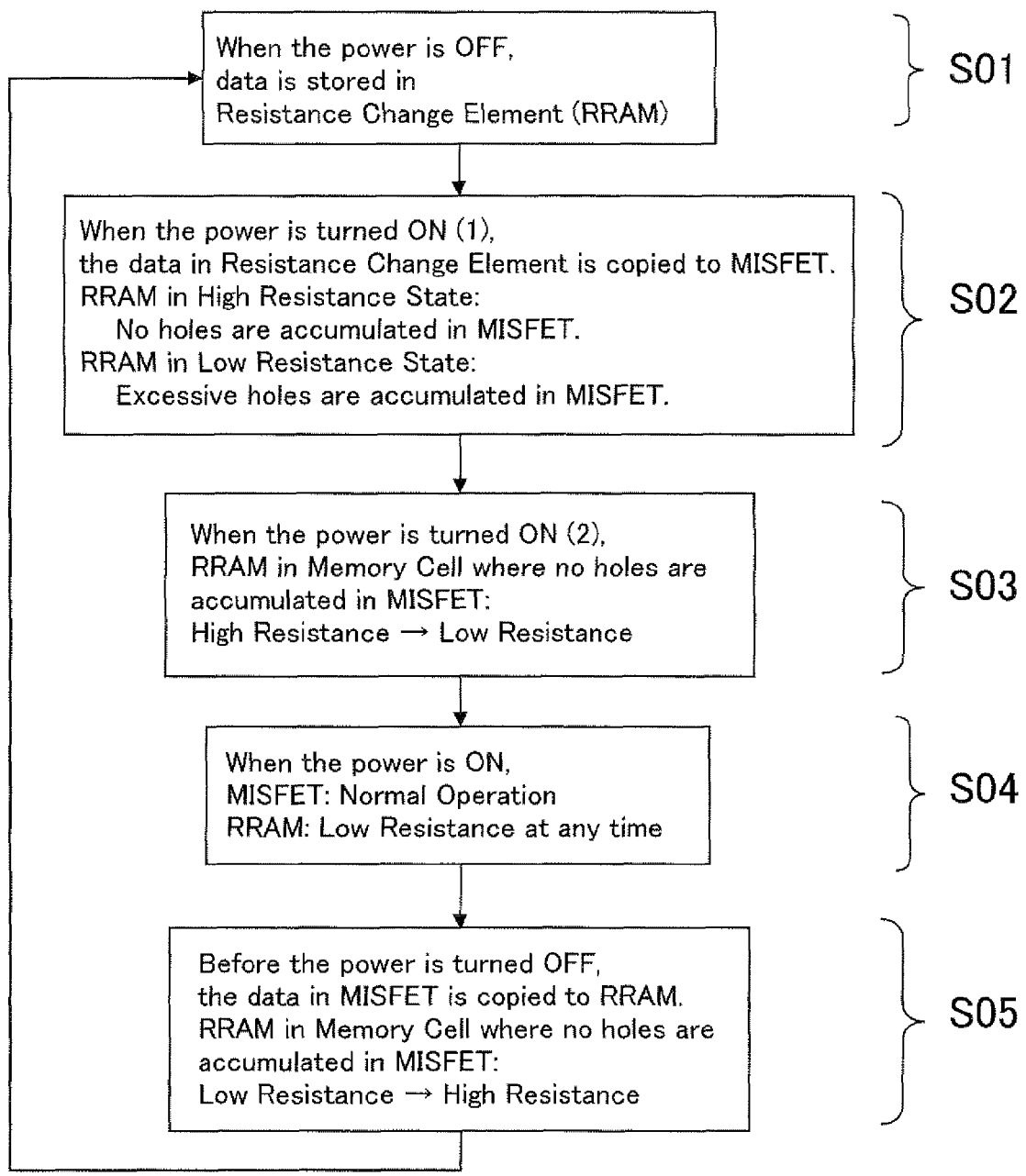
FIG. 10 is a flow chart showing the operation procedure of the semiconductor memory device according to the present invention.

Next, the method for operating the semiconductor memory device according to the present invention is described. The semiconductor memory device according to the present invention operates in sequence, as shown in FIG. 10. In the following, a concrete example is described following the sequence shown in FIG. 10. Herein, though concrete numeral values are used for the applied voltage in the following description of the operation, the actual applied voltage should, of course, be adjusted in accordance with the properties of the used MISFETs and resistance change elements.

Data is stored as the resistance state of the nonvolatile resistance change elements when the power is turned OFF (S01).

When the power is turned ON, an operation for copying the data stored as the resistance state of the resistance change elements to the accumulation state of a majority carrier (holes) in the channel body of the MISFETs is carried out (first set operation) (S02). This operation is described in reference to the circuit diagram of FIGS. 11A and 11B and the current voltage properties of the MISFET in FIG. 12.

Figure 11A:
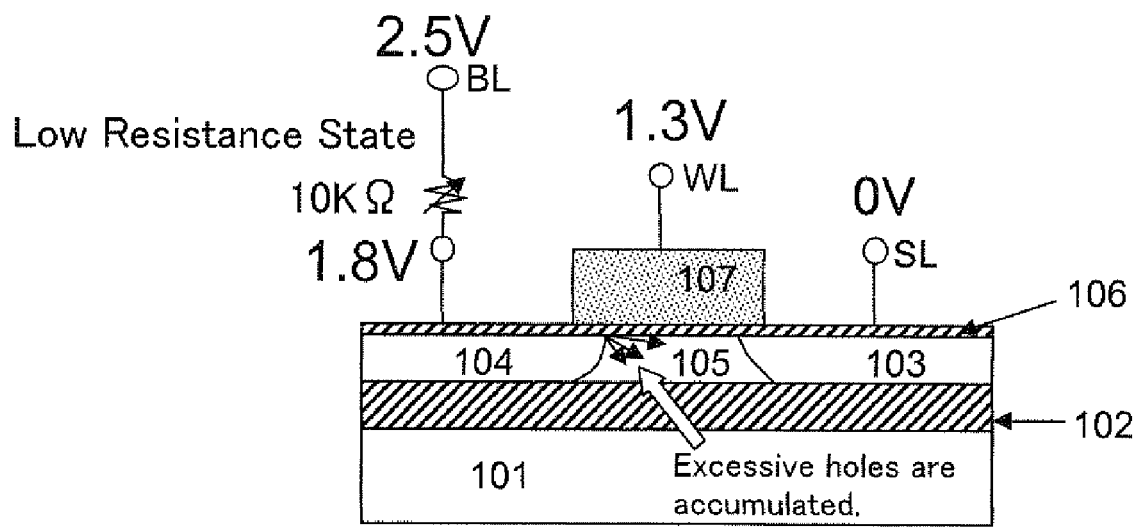
FIGS. 11A and 11B are circuit diagrams showing the structure of a memory cell according to the present invention.
Figure 12:
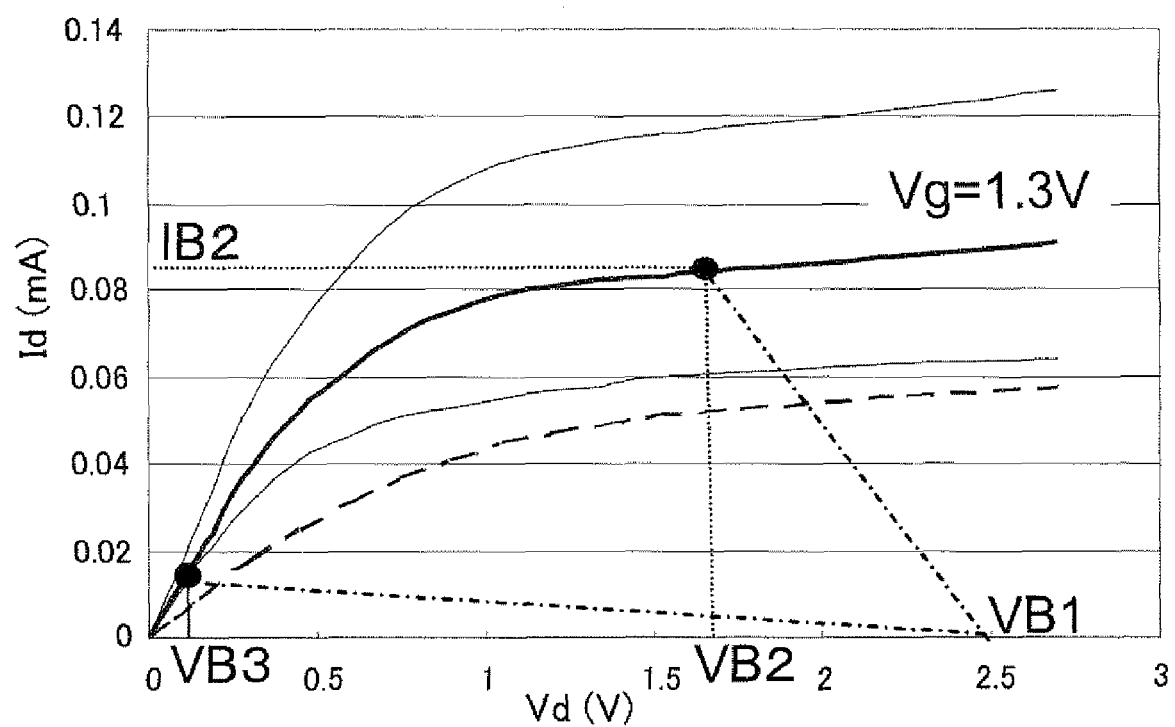
FIG. 12 is a graph showing the voltage current properties of a MISFET according to the present invention.

A gate voltage Vg (of 1.3 V) is applied via a word line (WL) and a voltage VB1 (of 2.5 V) is applied via a bit line (BL). Herein, the source terminal is grounded via a source line (SL). As shown in FIG. 12, the voltage VB1 applied between the bit line and the source terminal is divided in accordance with the respective resistance values for the resistance change element and between the source and the drain of the MISFET. When the resistance change element is in a low resistance state, a voltage VB2 is applied between the source and the drain, and the voltage VB1−VB2 is applied to the resistance change element. At this time, the voltage VB2 (of 1.8 V) between the source and the drain is greater than the threshold voltage for impact ionization, and therefore, a majority carrier is accumulated in the channel body region 105, so that the MISFET switches from the state "0" to the state "1." Meanwhile, the voltage VB1−VB2 (of 0.7 V) applied to the resistance change element is smaller than the threshold voltage V2 for switching the resistance change element from the low resistance state to the high resistance state, and thus, the resistance state of the resistance change element does not switch (FIG. 11A).

Figure 11B:
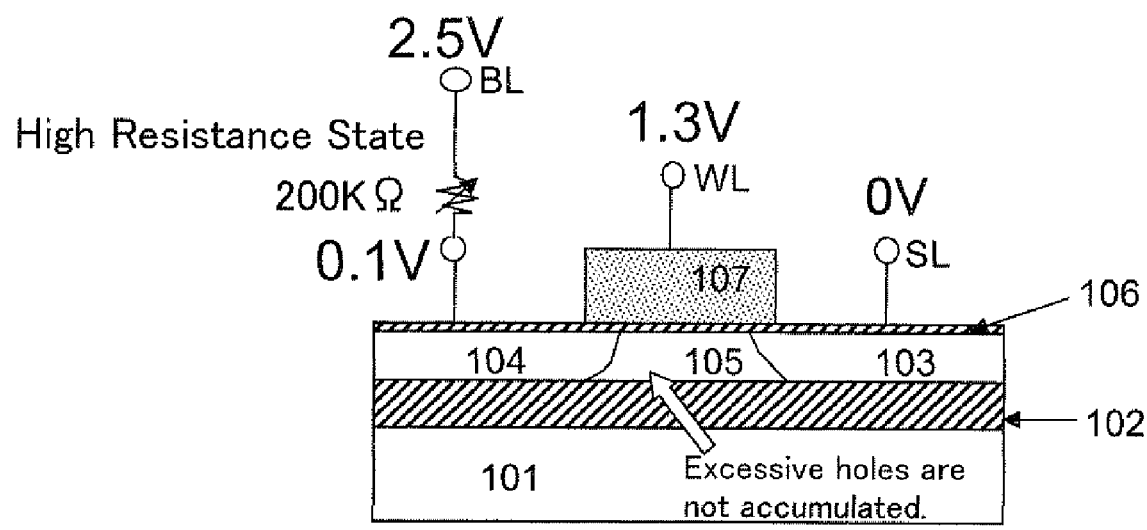

When the resistance change element is in a high resistance state, a voltage VB3 is applied between the source and the drain, and a voltage VB1−VB3 is applied to the resistance change element. At this time, the voltage VB3 (of 0.1 V) between the source and the drain is lower than the threshold voltage for impact ionization, and does not meet the conditions required to induce excessive majority carrier. Therefore, the majority carrier is not accumulated in the channel body region 105, and the MISFET remains in the state "0." Meanwhile, the voltage VB1−VB3 (of 2.4 V) applied to the resistance change element is lower than the threshold voltage V1 at which the resistance change element switches from the high resistance state to the low resistance state, and thus, the resistance state of the resistance change element does not switch (FIG. 11B).

As a result, the data stored as the resistance state of the resistance change element is copied in such a form that a majority carrier is either accumulated in the channel body region of the MISFET or not.

Next, an operation for switching the resistance state of the memory cells where a majority carrier is not accumulated in the channel body region of the MISFET from the high resistance state to the low resistance state is carried out (second set operation), so that all of the resistance change elements are converted to a low resistance state (S03).

First, the state of the memory cells is read out. At this time, a majority carrier is not accumulated in the MISFET within memory cells where the resistance change element is in a high resistance state, and therefore, the MISFET has a high threshold voltage and is in a high resistance state. Meanwhile, a majority carrier is accumulated in the MISFET within memory cells where the resistance change element is in a low resistance state, and therefore, the MISFET has a low threshold voltage and is in a low resistance state. Therefore, the MISFET corresponding to the resistance changing element is also in a high resistance state within memory cells where the resistance changing element is in the high resistance state, and thus, the read-out current is low, and the state is easy to detect.

In this read-out operation, respective predetermined voltages are applied to the bit line and the word line only in memory cells where the resistance change element is determined to be in a high resistance state, so that the state of the resistance change element switches from the high resistance state to the low resistance state. This operation is described in reference to the circuit diagram of FIGS. 13A and 13B and the current voltage properties of the MISFET in FIG. 14. Herein, a small load transistor of which the drive performance is approximately the same as that of the MISFET is connected to the MISFET and the resistance change element in series within the memory cells, via a bit line, in order to prevent the information stored in the MISFET from being programmed over as a result of a high voltage of not lower than the threshold voltage for impact ionization applied between the source and the drain of the MISFET when the resistance change element is switched to the high resistance state or to the low resistance state. The thick, solid curve i in FIG. 14 is the current voltage properties of the MISFET within a memory cell, and the thick, broken curve i' is the sum of the voltage applied between the source and the drain of the MISFET and the voltage applied between the two ends of the load transistor along the lateral axis, and the flowing amount of current along the longitudinal axis.

Figures 13A, 13B:
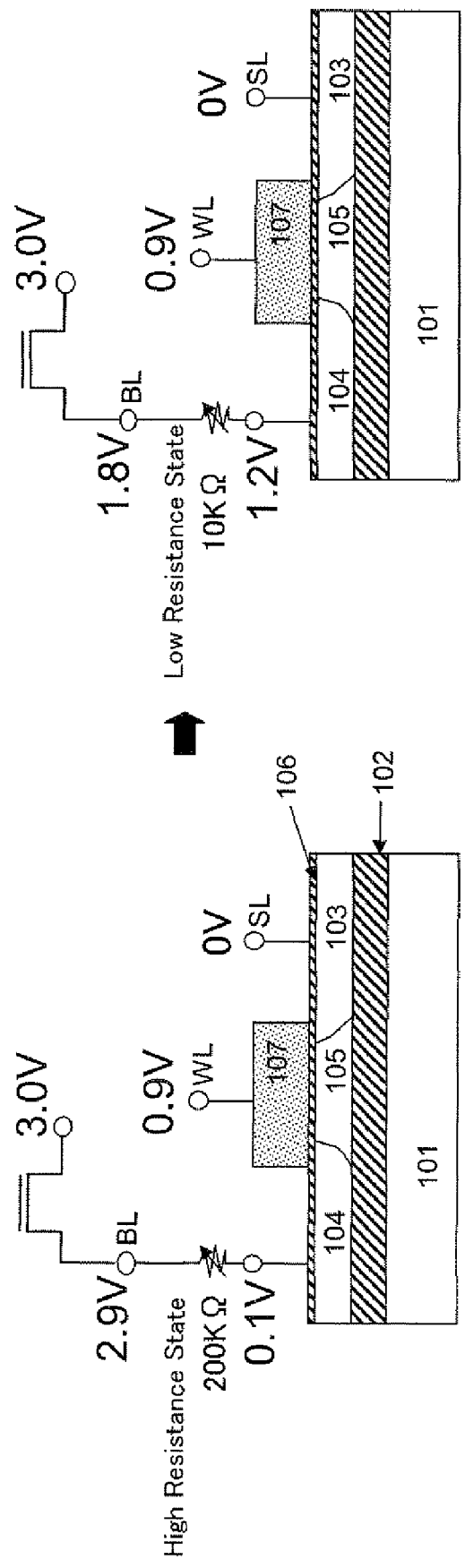
FIGS. 13A and 13B are circuit diagrams showing the structure of a memory cell according to the present invention.
Figure 14:
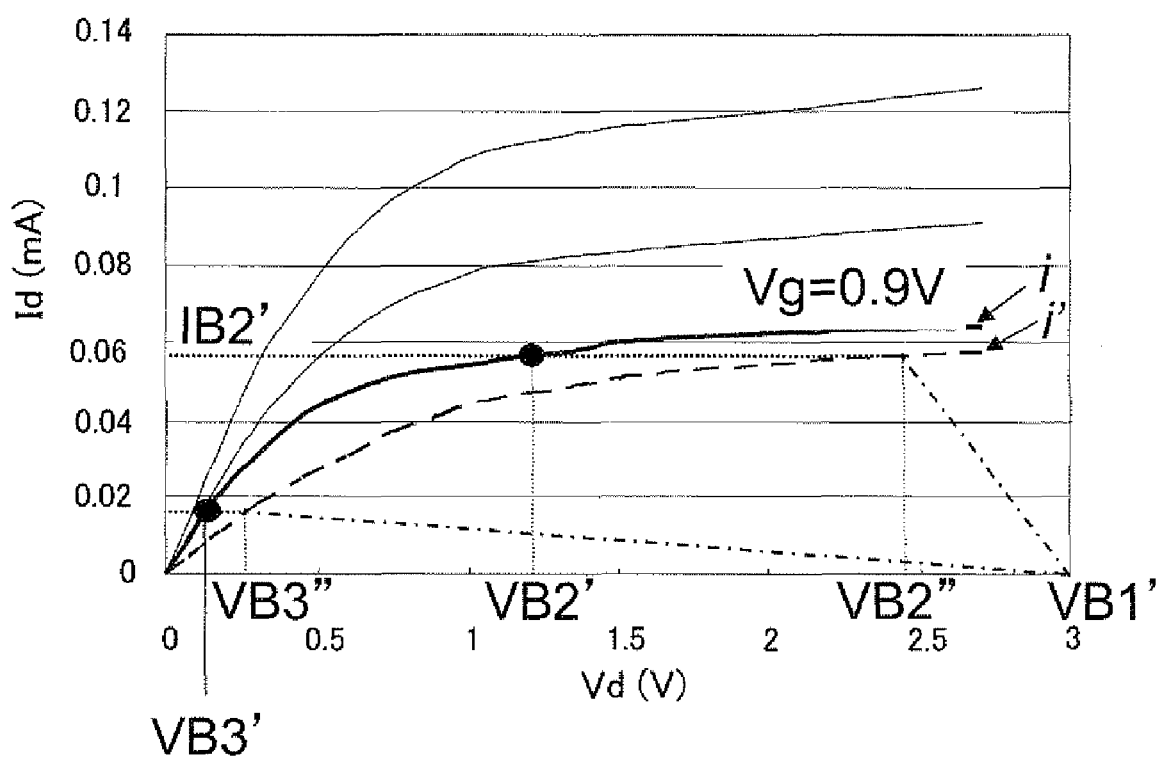
FIG. 14 is a graph showing the voltage current properties of a MISFET according to the present invention.

As shown in FIGS. 13A, 13B and 14, when a gate voltage Vg (of 0.9 V) is applied via a word line (WL) and a voltage VB1' (of 3.0 V) is applied via a bit line, the sum of the voltage applied between the source and the drain of the MISFET and the voltage applied between the two ends of the load transistor is VB3" (of 0.2 V), due to the resistance change element being in a high resistance state, and a voltage VB3' (of 0.1 V) is applied between the source and the drain of the MISFET and the voltage VB3"−VB3' (of 0.1 V) is applied to the load transistor. The voltage applied to the resistance change element VB1'−VB3" (of 2.8 V) is higher than the threshold voltage V1 for switching the resistance change element from a high resistance state to a low resistance state, and therefore, the resistance change element switches from a high resistance state to a low resistance state (FIG. 13A). The voltage VB1'−VB2" (of 0.6 V) applied to the resistance change element after the switch is lower than the threshold voltage V2 for switching the resistance change element from a low resistance state to a high resistance state, and therefore, the resistance change element stabilizes in a low resistance state. The voltage VB2' (of 1.2 V) applied between the source and the drain of the MISFET is lower than the threshold voltage for impact ionization, and the state of the majority carrier in the channel body region does not change (FIG. 13B).

After the data stored in the resistance change element is transferred to the MISFET through the above described process, so that the resistance state of the resistance change element becomes of a low resistance in all of the memory cells, the memory cells can be used as a nonvolatile memory where only the MISFET can be written and read out at random and at high speed, and thus it can be operated as a known SOI-DRAM (S04).

Before the power is turned OFF, the state of the MISFET in each memory cell is read out, and respective predetermined voltages are applied to the bit line and the word line only in memory cells where the majority carrier is not accumulated, so that an operation (reset operation) can be carried out in order to switch the state of the resistance change element within the memory cell from a low resistance state to a high resistance state, and thus, the data is stored as the resistance state of the resistance change element (S05). This operation is described in reference to the circuit diagram in FIGS. 15A and 15B and the current voltage properties of the MISFET in FIG. 16.

Figure 15:
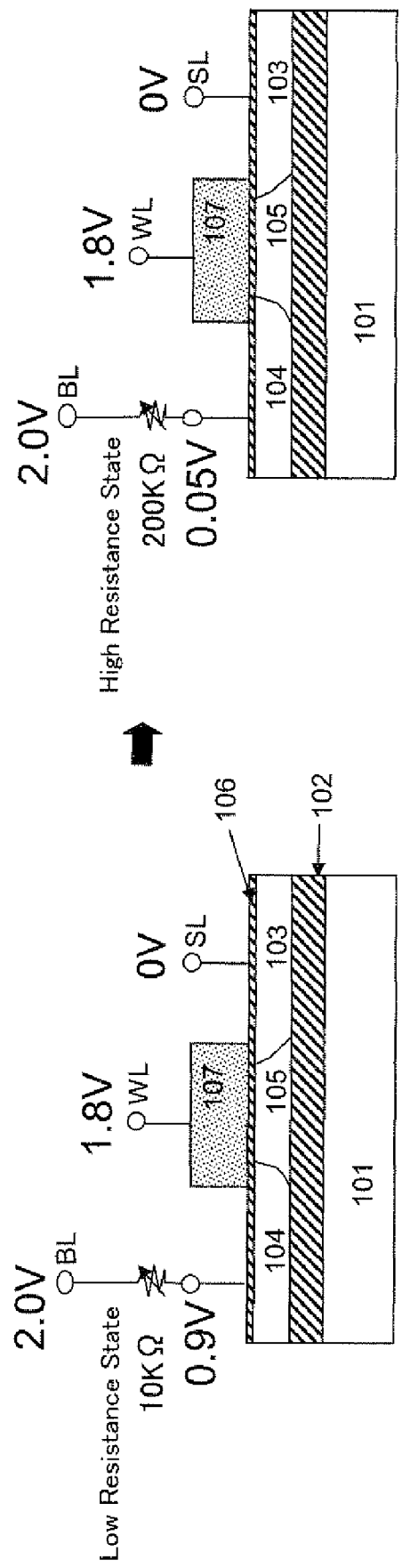
FIGS. 15A and 15B are circuit diagrams showing the structure of a memory cell according to the present invention.
Figure 16:
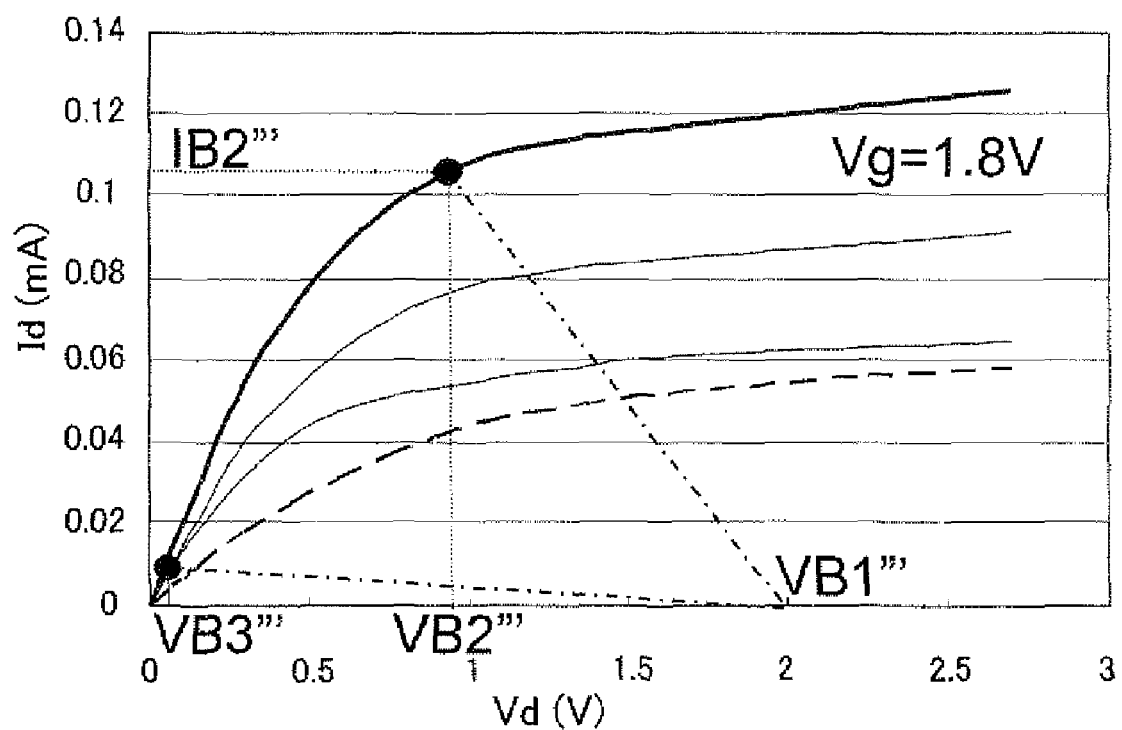
FIG. 16 is a graph showing the voltage current properties of a MISFET according to the present invention.

As shown in FIGS. 15A, 15B and 16, when a gate voltage Vg (of 1.8 V) which is higher than that at the time of the set operation is applied via a word line (WL) and a voltage VB1''' (of 2 V) is applied through a bit line, a current IB2''' flows between the source and the drain of the MISFET and the resistance change element. The current IB2''' flowing through the resistance change element is greater than the threshold current I2 for switching the resistance change element from a low resistance state to a high resistance state, and therefore, the resistance change element switches from a low resistance state to a high resistance state. The voltage VB1'''−VB3''' (of 1.95 V) applied to the resistance change element in a high resistance state after the switch is lower than the threshold voltage V1 for switching the resistance change element from a high resistance state to a low resistance state, and the resistance change element stabilizes in a high resistance state.

Both the voltage between the source and the drain of the MISFET before the switching to a high resistance state (VB2'''=0.9 V) and that after the switching (VB3'''=0.05 V) are smaller than the threshold voltage for generating impact ionization.

Figure 1A:
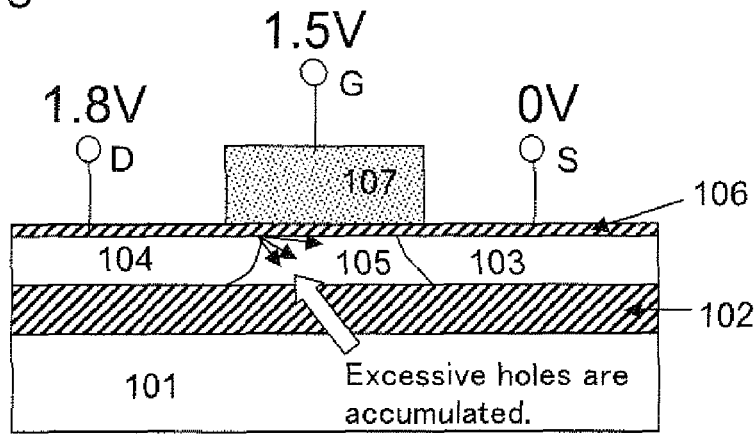
FIGS. 1A to 1C are cross-sectional diagrams showing the structure of an SOI-DRAM device.
Figure 1B:
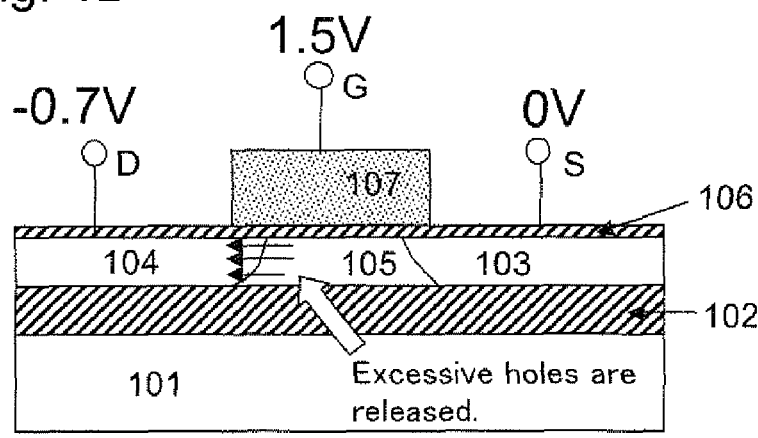
Figure 1C:
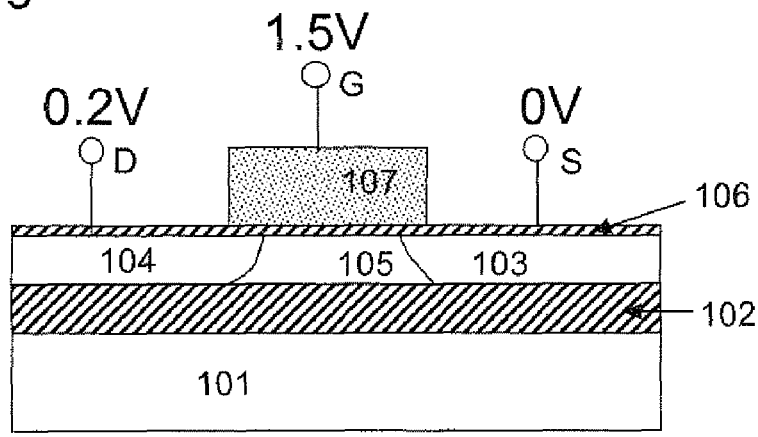
Figure 2:
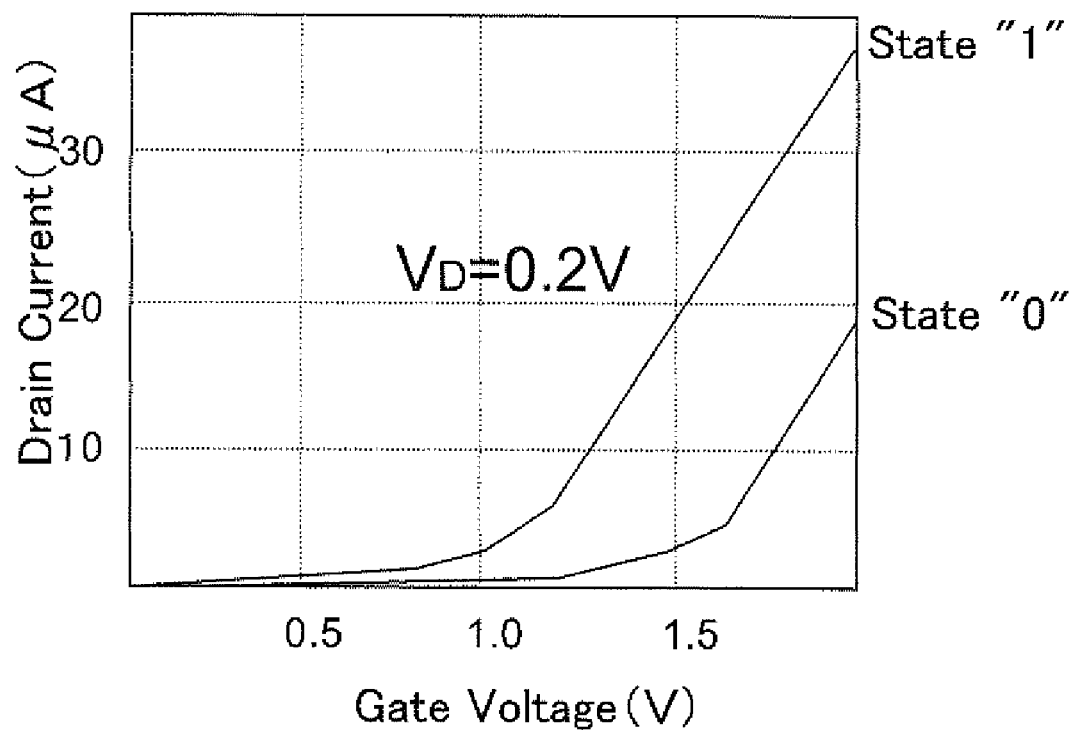
FIG. 2 is a graph showing the dependency of the drain current of SOI-DRAMs on the gate voltage.
Figure 3:
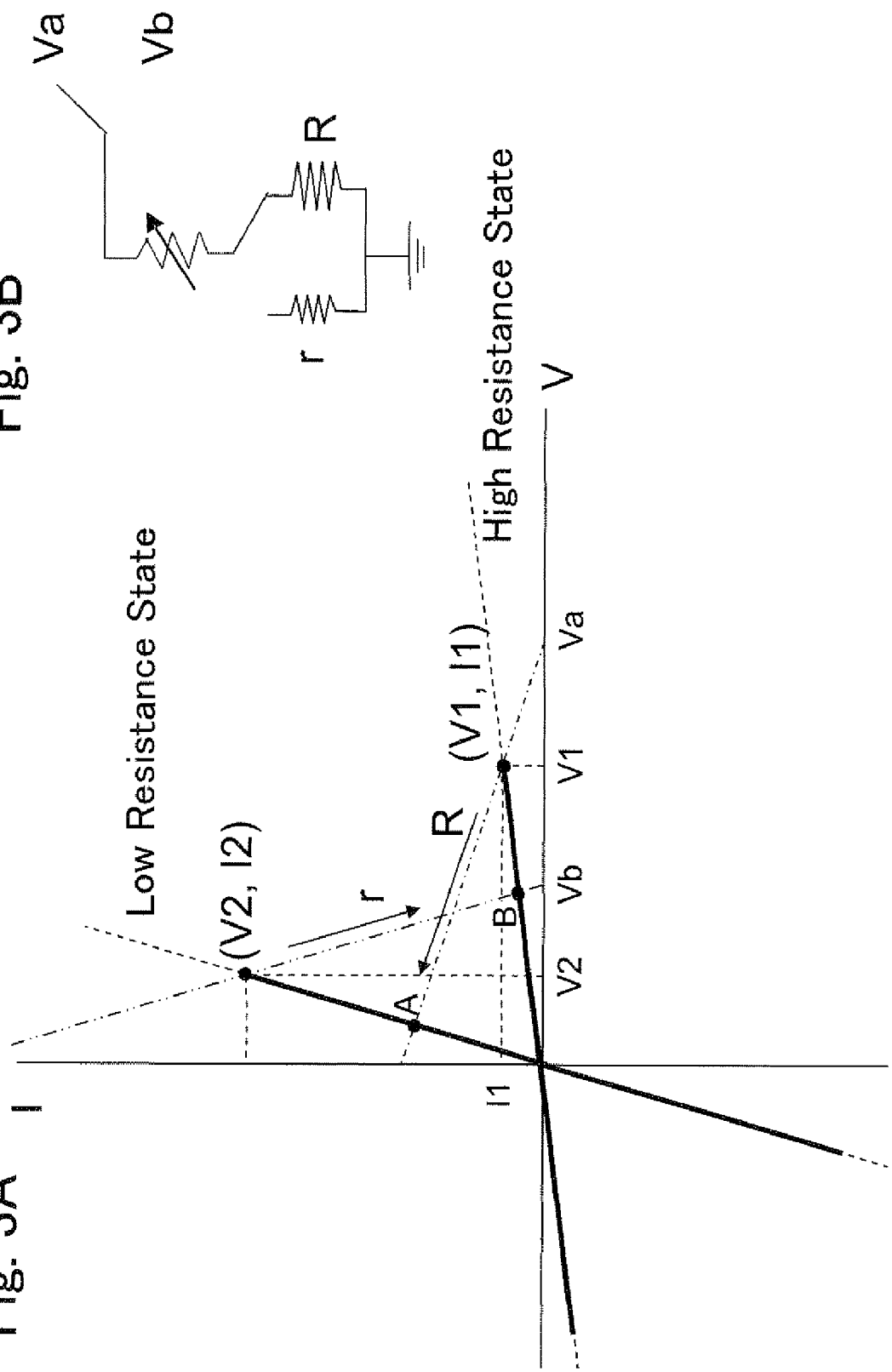
FIGS. 3A and 3B are diagrams showing the voltage current properties of a resistance change element (in the case of unipolar switching)
Figure 4:
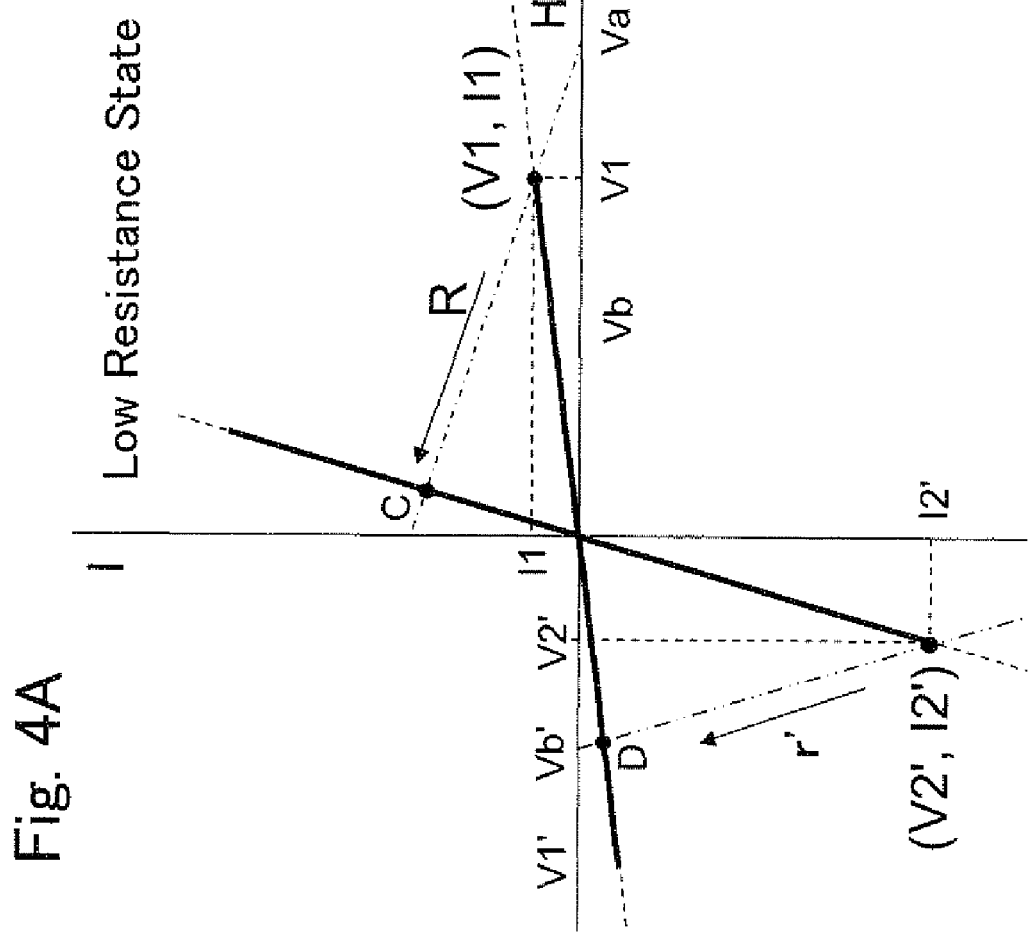
FIGS. 4A and 4B are diagrams showing the voltage current properties of a resistance change element (in the case of bipolar switching)
Figure 17:
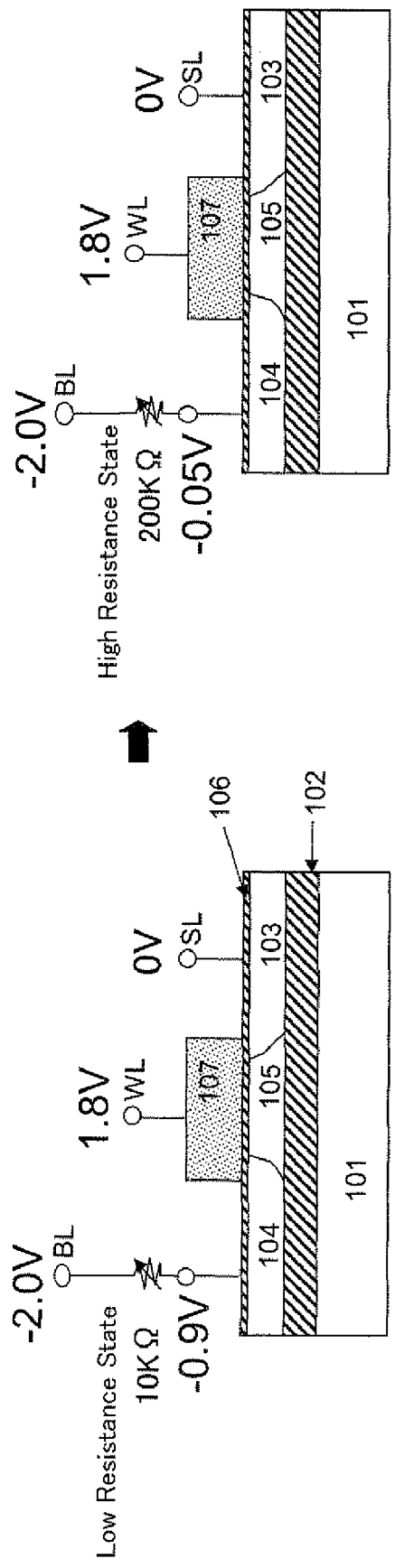
FIGS. 17A and 17B are circuit diagrams showing the structure of a memory cell according to the present invention.

Herein, in the case where the resistance change element has bipolar switching type properties, as in FIGS. 4A and 4B, a negative voltage may be applied to the bit line in order to switch the resistance change element from a low resistance state to a high resistance state. As shown in FIGS. 17A and 17B, when the current flowing between the source and the drain of a MISFET is greater than the threshold current I2' in FIGS. 4A and 4B, the resistance change element switches from a low resistance state to a high resistance state.

Through this operation, the data held in the channel body region of a MISFET is converted to the resistance state of the resistance change element and stored, so that the data can be held even after the power is turned OFF.

Second Embodiment

The semiconductor memory device according to the present invention operates in accordance with the above described operation method, and thus, a nonvolatile semiconductor memory device where random write and readout are possible an unlimited number of times can be provided. The system configuration is shown in the following.

Figure 18:
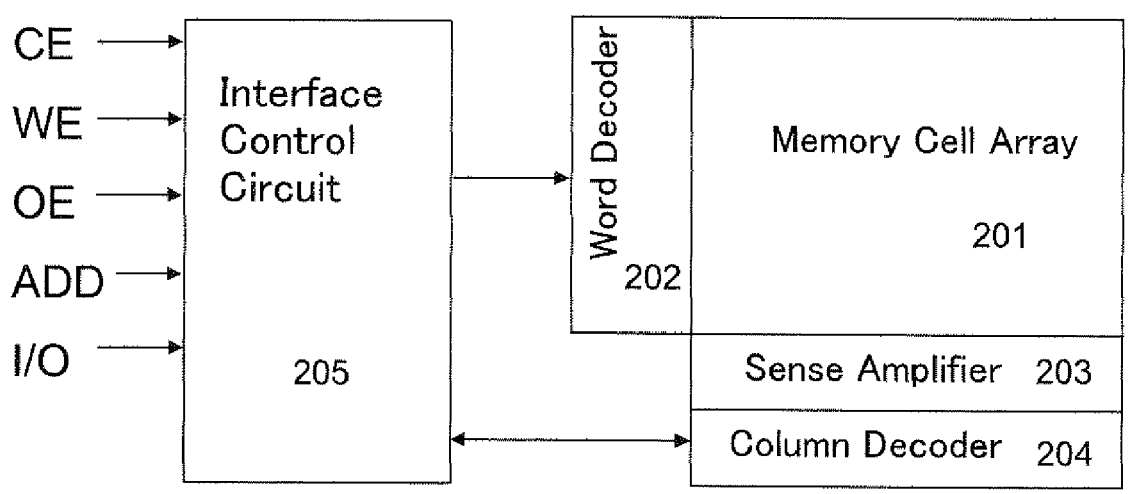
FIG. 18 is a block diagram showing the structure of the semiconductor memory device system according to the third embodiment of the present invention.

As shown in FIG. 18, the semiconductor memory device system according to the present invention is formed of a memory cell array 201 which is formed in accordance with the first embodiment of the present invention, a word decoder 202 which is connected to the word lines of the memory cell array 201 and driven by selecting the memory cells within the memory cell array 201 in the row direction, a sense amplifier 203 which is connected to the bit lines of the memory cell array 201, a column decoder 204 for selecting the memory cells within the memory cell array 201 in the column direction, and an interface control circuit 205 for controlling the voltage applied to the word lines and the bit lines. An address signal (ADD) is sent to the word decoder 202 and the column decoder 204 through the interface control circuit 205 and decoded to a word address and a column address, respectively. In addition, the interface control circuit 205 exchanges data with the outside through CE (chip enable), WE (write enable), OE (output enable) and I/O signals.

Each memory cell in the memory cell array 201 is formed of a resistance change element and a MISFET so as to have the function of both volatile and nonvolatile memory elements, and some of the memory cells can also be used as a nonvolatile memory region where only the resistance state of the resistance change element can be used as storage data. An optimal voltage applied to the bit lines and the word lines for writing and reading operations by switching the states of the resistance change elements and the MISFETs is stored in the nonvolatile memory region through programming, and thus, the interface control circuit 205 controls the writing and reading operation, so that the programmed voltage is applied to the bit lines and the word lines.

Third Embodiment

Figure 19:
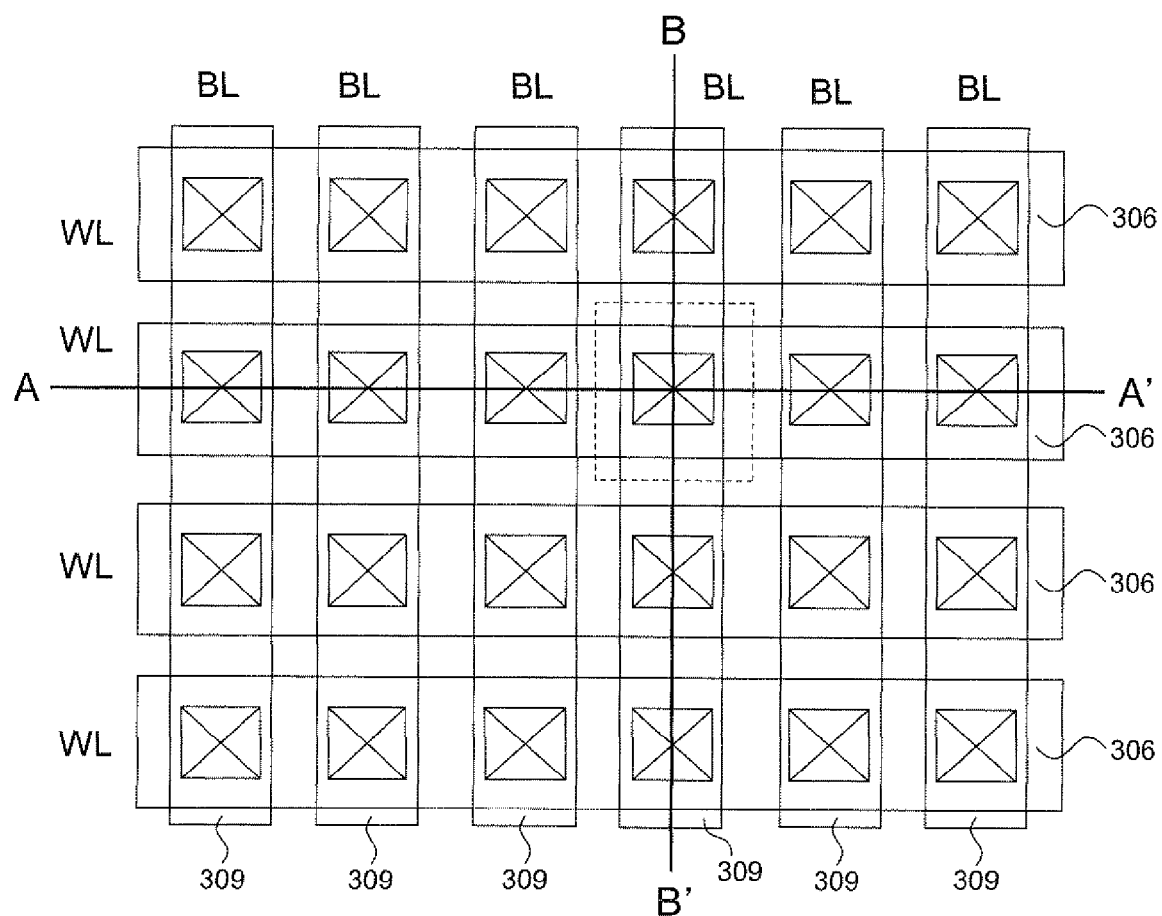
FIG. 19 is a diagram showing the layout of the semiconductor memory device according to the third embodiment of the present invention.
Figure 20A:
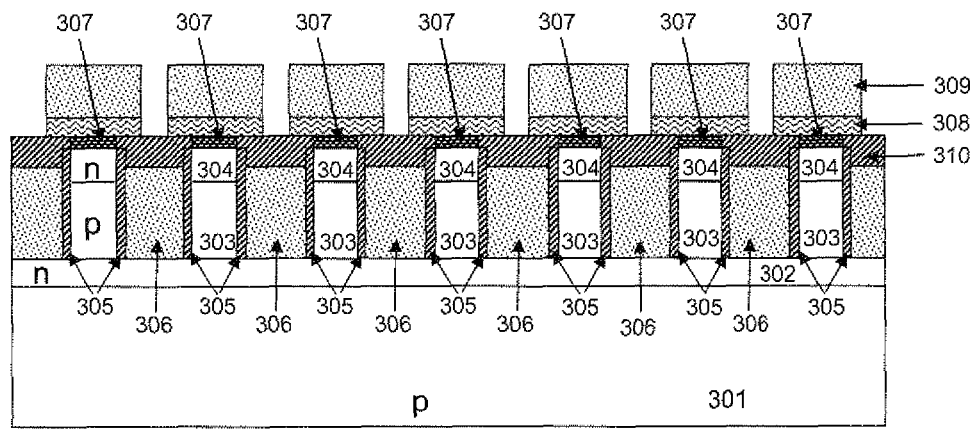
FIGS. 20A and 20B are cross-sectional diagrams showing the semiconductor memory device according to the third embodiment of the present invention.
Figure 20B:
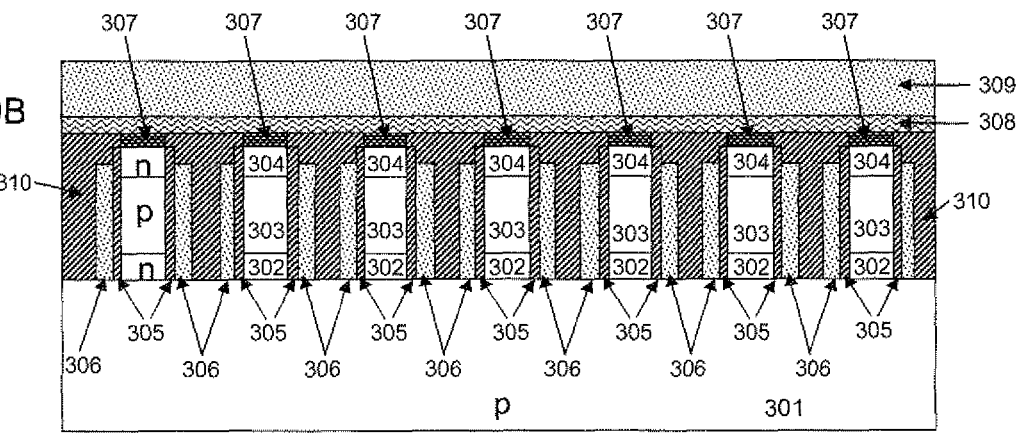
Figure 21:
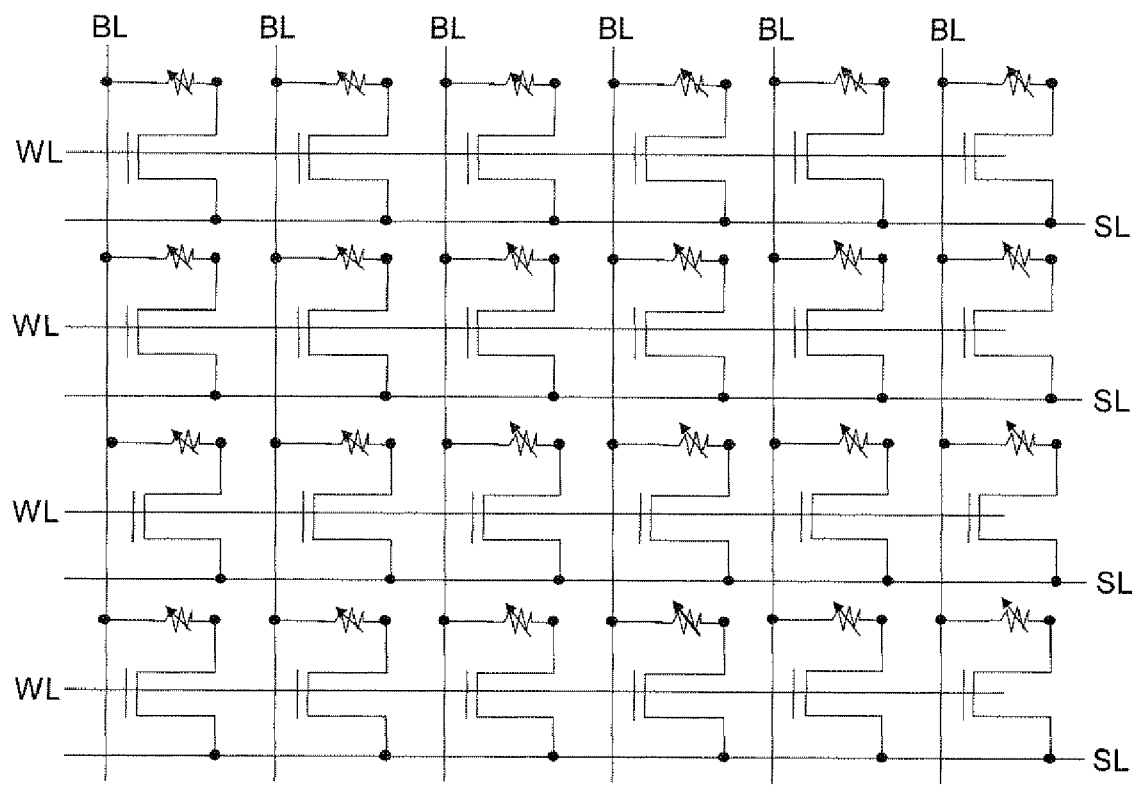
FIG. 21 is an equivalent circuit diagram showing the semiconductor memory device according to the third embodiment.

FIG. 19 shows the structure of the semiconductor memory device (memory cell array) according to the third embodiment of the present invention, and FIGS. 20A and 20B show the structure in a cross section. FIGS. 20A and 20B are cross-sectional diagrams along A-A' and B-B', respectively, in FIG. 19. FIG. 21 shows an equivalent circuit of the structure in FIGS. 19, 20A and 20B. The third embodiment is different from the first embodiment in that the MISFETs having a channel body, which is electrically isolated from the semiconductor substrate, are provided as vertical transistors with the channel body region covered with an insulating film.

Vertical transistors in column form are formed in the direction of the depth such that n type source regions 302, p type channel body regions 303 and n type drain regions 304 are formed on top of a p type semiconductor substrate 301 in this order. Herein, the source regions are connected in the row direction (A-A' direction), so that source lines are formed (FIG. 20A). The side walls of the channel body regions 303 are completely covered with the gate isolating film 305, and thus, the channel body regions 303 are electrically isolated from the semiconductor substrate 301. Gate electrodes 306 are formed to the side of the channel body regions 303 with the gate insulating film 305 in between, and thus, the gate electrodes 306 are connected in the row direction (A-A' direction), so that word lines extending in the row direction are formed. Contact plugs 307 are formed on top of the drain regions 304 so as to electrically connect the drain regions 304 to the bottom of the resistance change material layer 308. The contact plugs 307 are a combination of a Ti/TiN barrier metal and W, which is generally used in silicon processes. The resistance change material layer 308 is made of a material of which the resistance changes when a voltage is applied, and a metal oxide film, such as of Co, Ni or Ti, a chalcogenide film, or a solid electrolyte film can be used. The top of the resistance change material layer 308 is connected to the metal wires 309, and the metal wires 309 form bit lines extending in the column direction. The space between vertical transistors is filled in with an interlayer insulating film 310.

The above described semiconductor memory device can be fabricated as follows. (1) An n type layer 302 which becomes source regions, a p type layer 303 which becomes channel body regions, and an n type layer 304 which becomes drain regions are formed on top of a p type semiconductor substrate 301 in this order. The above described impurity layers can be formed using a standard manufacturing process, for example through ion implantation or epitaxial growth. (2) Trenches which hit the lower n type layer 302 are created through dry etching, so that rectangular silicon pillars made of a source region 302, a channel body region 303 and a drain region 304 remain. At this time, dry etching is carried out, so that only the lower n type layer 302 remains connected between the silicon pillars in the row direction, and thus, source lines are formed. Herein, the space between silicon pillars in the column direction is approximately 1.5 times that in the row direction. The size of the silicon pillars is such that the bottom is a square of 180 nm, for example, and the distance between the silicon pillars is approximately 240 nm. (3) A gate oxide film 305 is formed on the side walls of the silicon pillars made of a source region 302, a channel body region 303 and a drain region 304 through thermal oxidation. The film thickness of the gate oxide film may be approximately 6 nm. (4) Polycrystal silicon is deposited to such a film thickness that only the trenches in the row direction (A-A' direction) are completely filled. As a result, the polycrystal silicon is connected in the row direction (A-A' direction), so that word lines 306 are formed. (5) The connection of the polycrystal silicon in the column direction (B-B' direction) is cut through etchback using dry etching, and after that, the space in trenches which are not filled in is filled in with an oxide film 310, which becomes an interlayer insulating film. Herein, etchback is carried out using a conventional chlorine based dry etching gas for etching polycrystal silicon, for example a mixed gas of a boron trichloride gas and a chlorine gas. (6) After a flattening process using CMP, contact holes for the connection to the drain regions 304 on top of the silicon pillars are created in the interlayer insulating film, and then filled in with contact plugs 307. (7) A resistance change material thin film 308 is formed on top of the contact plugs 307, and metal wires 309 are further formed on top, and thus, bit lines extending in the column direction are formed. The resistance change material is a Co oxide film, for example, and the film thickness may be approximately 10 nm.

When the word lines and the bit lines in the above described layout are provided with the minimum size F, the area of the unit cells becomes $6F^2$ (F is the minimum size required for processing), because the space between the silicon pillars in the column direction is 1.5 times that in the row direction. Herein, it is also possible to form the cells with the same space between silicon pillars in the column direction and the row direction, and the area of the unit cells in this case is $4F^2$, and thus, a memory cell array having a smaller area can be implemented.

The above described semiconductor memory device operates in accordance with the operation method described in the first embodiment, and the system configuration in the second embodiment is adopted, and thus, a nonvolatile semiconductor memory device which makes random write and readout possible an unlimited number of times can be provided.

Herein, the above described embodiments are examples of the preferred embodiments of the present invention. The embodiments of the present invention are not limited to these, and various modifications are possible, as long as the embodiments do not deviate from the gist of the present invention.

Other Embodiments

In the following, other embodiments of the present invention are described.

(1) Though in the semiconductor memory device according to the present invention, a metal oxide used in RRAMs, specifically, a Co oxide, is cited as an example of a resistance change material that can be used for nonvolatile memory elements, other than metal oxides, any material which can be switched between two or more states with different resistance values by applying a voltage may be used, and other materials which is switched between a crystal state, which is a low resistance state, and an amorphous state, which is a high resistance state, depending on the applied voltage and the applying time, for example a chalcogenide compound used in PCRAMs, or which is switched between a low resistance state where a metal is deposited and a high resistance state where a metal is dissolved in solid electrolyte by switching the applied voltage between positive and negative, for example solid electrolyte used for conductive bridging memories, may be used. Furthermore, materials where the resistance in the joint interface with an electrode material changes when a voltage is applied, for example a metal oxide having a Perovskite structure, may be used.

(2) As for the device structure of the MISFET used for the volatile memory elements in the semiconductor memory device according to the present invention, the first embodiment is an example where the MISFETs are formed on an SOI substrate, and the third embodiment is an example where vertical MISFETs of which the channel body region is electrically isolated form the semiconductor substrate are provided. However, the present invention is not limited to these two device structures, and any MISFET where the channel body region is electrically isolated from the semiconductor substrate so that information on the majority carrier can be stored in the channel body region may be formed as a volatile memory element in the memory cells.

The present invention can be used for semiconductor memory devices having both volatile memory elements and nonvolatile memory elements, and in particular, for nonvolatile semiconductor memory devices which make random write and readout possible at high speed and an unlimited number of times by storing data in the nonvolatile memory elements before the power is turned OFF and transferring the data stored in the nonvolatile memory elements to volatile memory elements when the power is turned ON.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising
a plurality of memory cells each having a MISFET and a resistance change element, the MISFET having a channel body that is electrically isolated from a semiconductor substrate, the resistance change element having a two-terminal structure with one terminal electrically connected to a drain of the MISFET, wherein
the MISFET functions as a volatile memory element for storing a first state where a majority carrier is accumulated in the channel body and a second state where the majority carrier in the channel body is released, and
the resistance change element functions as a nonvolatile memory element for holding two or more states having different resistance values and for being switched between the states in a reversible manner when a voltage is applied.

2. The semiconductor memory device according to claim 1, wherein
the MISFET has a source, a drain and a channel body region within a semiconductor layer that is electrically isolated from the semiconductor substrate with an insulating film, and a gate electrode formed above the channel body region with a second insulating film in between.

3. The semiconductor memory device according to claim 1, wherein
the MISFET has a source region, a channel body region and a drain region in this order, each of which is formed as a layer within a region in column form on the semiconductor substrate in a depth direction, side walls of the channel body region are completely covered with an insulating film so as to be electrically isolated from the semiconductor substrate, and a gate electrode is formed to a side of the channel body region with the insulating film in between.

4. The semiconductor memory device according to claim 1, wherein
the memory cells are arranged in a matrix,
gate electrodes of the MISFETs aligned in a same row are connected to a common word line extending in a row direction,
other terminals of the resistance change elements having the one terminals connected to drain regions of the MISFETs aligned in a same column are connected to a common bit line extending in a column direction, and
source regions of the MISFETs are connected to ground or a fixed potential.

5. The semiconductor memory device according to claim 4, wherein in a set operation mode, data stored as a resistance state of the resistance change element is transferred to the MISFET as an accumulation state of a majority carrier in the channel body of the MISFET so that the memory cell operates as a volatile memory device, and in a reset operation mode, data stored as the accumulation state of the majority carrier in the channel body of the MISFET is transferred to the resistance change element and stored as the resistance state of the resistance change element.

6. The semiconductor memory device according to claim 5, wherein the set operation mode has a first set operation mode and a second set operation mode, in the first set operation mode, data stored as the resistance state of the resistance change element is copied as the accumulation state of the majority carrier in the channel body of the MISFET by applying respective predetermined voltages to a word line and a bit line of the memory cell, the predetermined voltages allowing the majority carrier to be accumulated in the channel body of the MISFET of the memory cell where the resistance change element is in a low resistance state, but not allowing the majority carrier to be accumulated in the channel body of the MISFET in the memory cell where the resistance change element is in a high resistance state, and in the second set operation mode, a state of the resistance change element is switched from the high resistance state to the low resistance state by selecting the memory cell where the resistance change element is in a high resistance state and applying respective predetermined voltages to the word line and the bit line of the selected memory cell.

7. The semiconductor memory device according to claim 6, wherein the resistance state of the resistance change element is not switched in the first set operation mode.

8. The semiconductor memory device according to claim 6 further comprising a load transistor that is connected in series to the MISFET and the resistance change element within the memory cell via the bit line in the second set operation mode, wherein a part of a voltage applied to the resistance change element when the resistance change element is in the high resistance state is applied to the load transistor when the resistance change element shifts to the low resistance state so that a voltage applied between the source and drain of the MISFET is equal to or lower than a threshold value for inducing the majority carrier to the channel body.

9. The semiconductor memory device according to claim 6, wherein in the reset operation mode, the state of the MISFET within the memory cell is read out and respective predetermined voltages are selectively applied to the bit line and the word line in the memory cell where the majority carrier is not accumulated so that the state of the resistance change element within the memory cell is switched from the low resistance state to the high resistance state.

10. The semiconductor memory device according to claim 4, wherein some of the memory cells arranged in a matrix are used as a nonvolatile memory region where only the resistance state of the resistance change elements is used as stored data.

11. The semiconductor memory device according to claim 5, wherein some of the memory cells arranged in a matrix are used as a nonvolatile memory region where only the resistance state of the resistance change elements is used as stored data, operation conditions at a time of the set operation mode and the reset operation mode are stored in the nonvolatile memory region, and each state of the MISFET and the resistance change element changes in accordance with the operation conditions stored in the nonvolatile memory region in the set operation mode or the reset operation mode.

* * * * *